United States Patent [19]
Resnikoff et al.

[11] Patent Number: 5,148,498
[45] Date of Patent: Sep. 15, 1992

[54] IMAGE CODING APPARATUS AND METHOD UTILIZING SEPARABLE TRANSFORMATIONS

[75] Inventors: Howard L. Resnikoff, Winchester; David Pollen, Lexington; David C. P. Linden, Cambridge; Wayne M. Lawton, Somerville, all of Mass.

[73] Assignee: Aware, Inc., Cambridge, Mass.

[21] Appl. No.: 561,449

[22] Filed: Aug. 1, 1990

[51] Int. Cl.$^5$ .............................................. G06K 9/36
[52] U.S. Cl. .................................... 382/54; 358/432; 364/724.05; 382/56
[58] Field of Search ...................... 382/27, 44, 54, 56; 358/429, 432, 433, 467, 141; 364/724.05, 724.16

[56] References Cited

U.S. PATENT DOCUMENTS

| | | | |
|---|---|---|---|
| 4,328,426 | 5/1982 | D'Ortenzio | 364/724.05 |
| 4,805,226 | 2/1989 | Guebey | 382/27 |
| 4,817,180 | 3/1989 | Cho et al. | 382/54 |
| 4,817,182 | 3/1989 | Adelson et al. | 364/724.05 |
| 4,821,223 | 4/1989 | David | 364/724.05 |
| 4,829,378 | 5/1989 | LeGall | 358/141 |

Primary Examiner—Leo H. Boudreau
Assistant Examiner—David Fox
Attorney, Agent, or Firm—McCubbrey, Bartels, Meyer & Ward

[57] ABSTRACT

An image coding apparatus and method are disclosed. The method and apparatus are applicable to coding any array of arbitrary dimension. The apparatus utilizes FIR filters which generate three or more sets of coefficients from linear arrays generated from the array being coded. Each set of coefficients represents spatial frequency information of different frequencies. The filters utilize coefficient sets which are preferably orthogonal.

14 Claims, 11 Drawing Sheets

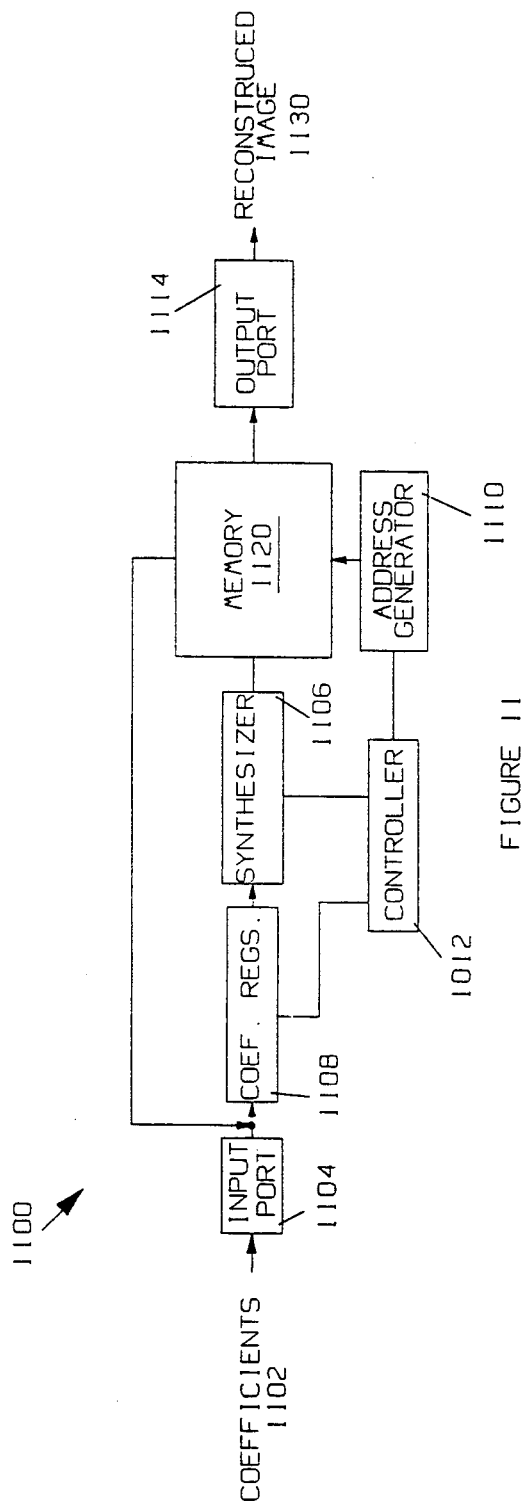

IMAGE CODING APPARATUS AND METHOD UTILIZING SEPARABLE TRANSFORMATIONS

FIELD OF THE INVENTION

The present invention relates to data processing systems, and more particularly, to image compression apparatuses and methods.

BACKGROUND OF THE INVENTION

Images are conventionally represented by a two dimensional array of values in which each value represents a property of the image at a corresponding point on the image. In the case of gray-scale images, a single number representing the gradations of intensity from white to black, referred to as the gray scale, is stored. In the case of color images, each "value" is a vector whose components represent the gradations in intensity of the various primary colors, or some alternative color code, at the corresponding point in the image.

This representation of an image corresponds to the output of a typical image-sensing device such as a television camera. Such a representation is convenient in that it is easily regenerated on a display device such as a CRT tube. However, it has at least two shortcomings. First, the number of bits needed to represent the data is prohibitively large for many applications. Second, if the image is to be processed to extract features that are arranged in the same order of importance as that perceived by a person viewing the image, the amount of processing needed can be prohibitively large.

The number of bits needed to store a typical image is sufficiently large to limit the use of images in data processing and communication systems. A single $512 \times 512$ gray-scale image with 256 gray levels requires in excess of 256,000 bytes. A small-scale computer user is limited to disk storage systems having a capacity of typically 300 Mbytes. Hence, less than 1200 images can be stored without utilizing sone form of image compression.

Similarly, the transmission of images over conventional telephone circuitry is limited by the large number of bits needed to represent the image. If an $8 \times 11$ inch image were digitized to 256 gray levels at 200 dots per inch (the resolution utilized in typical FAX transmissions), in excess of 28 million bits would be required. Normal consumer-quality analog telephone lines are limited to a digital communication rate of 9600 bits per second. Hence, the transmission of the image would require in excess of 45 minutes in the absence of some form of image compression.

The need to reduce the data required to represent an image has led to numerous image compression methods. These methods can be conveniently divided into two classes, invertible and non-invertible methods. The invertible methods reduce redundancy but do not destroy any of the information present in the image. These methods transform the two-dimensional array into a form requiring fewer bits to store. The original two-dimensional array is generated by the inverse transformation prior to display. The regenerated image is identical to the original image.

Consider a gray-scale image which has been digitized to two gray levels, black and white. Such an image is often referred to as a binary image, since the gray level of each pixel is either a one or zero. Hence, the image consists of a two-dimensional array of bits. A one-dimensional list of bits can be generated from the two-dimensional array by copying, in order, each row of the two-dimensional array into the one-dimensional array. It has been observed that the one-dimensional array has long runs of ones or zeros. Consider a run of 100 ones. One hundred bits are required to represent the run in the one-dimensional array. However, the same 100 bits could be represented by a 7-bit counter value specifying the length of the run and the value "one" specifying the repeated gray level. Hence, the 100 bits can be reduced to 8-bits. This is the basis of a transformation of the one-dimensional array in which the transformed image consisting of a sequence of paired values, each pair consisting of a count and a bit value.

One can define a compression ratio which is the ratio of the number of bits in the original two-dimensional array to the number of bits needed to store the transformed image. For typical binary images, compression ratios of the order of 5 to 10 can be obtained utilizing these methods. However, the gains obtained decrease rapidly as the number of gray levels is increased. For larger numbers of gray levels, the probability of finding repeated runs of the same gray level decreases. Each time the gray level changes, a new pair of values must be entered into the file. As a result, compression ratios exceeding 3 are seldom obtained for invertible compression of gray-level images.

Higher compression ratios can be obtained if non-invertible compression methods are utilized. In such methods, the image regenerated by the inverse transformation is not identical to the original image.

Conventional error measures are of only limited value in comparing two non-invertible compression methods. For example, consider two transformations. The first transformation results in random noise being introduced into the regenerated image. That is, each pixel in the regenerated image differs from that in the original image by an amount which is randomly distributed between two values. The second transformation results in a constant having a value equal to the difference between these two values being added to each pixel in a narrow band across the image. The second transformation introduces an error having a root-mean-squared error which is significantly less than that introduced by the first transformation. However, the regenerated image produced by the first transformation is far more agreeable or satisfactory to a human viewer than that produced by the second transformation.

The typical prior art non-invertible image compression methods can be divided into two steps. In the first step, two sets of numerical coefficients, $p_i$ and $q_j$, are derived from the image by fitting the image to a linear expansion of the form $$I(x,y) = \Sigma_i p_i F_i(x,y) + \Sigma_j q_j G_j(x,y)$$

As will be explained in more detail below, the basis functions $F_i$ and $G_j$ are chosen such that the most "important" information contained in the image is represented by the p's and the least inportant information is represented by the q's. The transformation in question is invertible in the sense that given an $N \times N$ set of pixels $I(x_i, y_j)$, one can determine a total of $N^2$ coefficients $p_i$ and $q_i$ that will exactly reproduce the $N^2$ values $I(x_i, y_j)$. Since there are $N^2$ pixels and $N^2$ coefficients, the set of coefficients requires the same number of bits to store as the image if the transform coefficients are stored to the same precision as the image pixel intensities. Hence, the transformation alone does not produce any compression of the image.

In the second step of the image compression method, the coefficients $p_i$ and $q_j$ are quantized. The number of bits used to represent each $p_i$ is greater than that used to represent each $q_j$, since the $p_i$ represent the most important information in the image. Thus the $p_i$'s will be able to be recovered more accurately than the $q_j$'s. The reduced precision utilized in the representation of the $q_j$'s and $p_i$'s is the source of the non-invertibility of the transformation.

For the above discussed technique to be useful, the image transformation must separate the information into coefficients having the property that the different sets of coefficients contain image information of different importance. If is known that the most subjectively important image information is contained in the low spatial frequency components of the image. Hence, the functions $F_i(x,y)$ must be limited in their spatial frequency response to lower frequencies than the functions $G_j(x,y)$. If this condition is satisfied, then the coefficients $p_i$ will represent more subjectively important information than the coefficients $q_j$.

In addition to the low spatial frequency information, specific images may have information in high-frequency components that is also important. Edges typically contribute to the high spatial frequency data. An image with a large number of edges oriented in a specific direction will therefore have a significant high-frequency component if one or more of the $G_j$ functions represents edges having the orientation in question. Hence, it would be advantageous to be able to divide the $G_j$ functions into sub-classes such that one or more of the sub-classes can be quantized with increased accuracy when the coefficients associated with the sub-class indicate that a significant amount of information is contained in that sub-class.

In addition, systems of basis functions which reflect or approximate the structures found in typical images are more likely to require fewer terms to represent an image with a given degree of fidelity. It is known that images tend to include structures having limited spatial extent which vary in intensity smoothly over the structure. Hence, sets of basis functions in which the $F_i$ can approximate compact objects having intensities which are proportional to low order polynomials, i.e., constants, linear, and quadratically varying surfaces, would be advantageous. If the basis functions are orthonormal, this is equivalent to requiring that at least the low order moments of each of the basis functions $G_j$ vanish, for then the low order polynomial information is represented by the basis functions $F_i$.

To better understand the cause of the errors and the manner in which the transformation in the first step of the compression affects the type of errors, the manner in which the quantization is performed will now be discussed in more detail. To simplify the discussion, it will be assumed that only the $p_i$ coefficients are quantized to more than zero bits. That is, zero bits will be allocated for each of the $q_j$. It will also be assumed that each coefficient $p_i$ will be allocated K bits. Let $P_{min}$ and $P_{max}$ be the minimum and maximum values, respectively, of the set of parameters $\{p_i\}$. In the simplest case, $2^k$ equally spaced levels, denoted by $L_j$, are defined between $P_{min}$ and $P_{max}$. Each coefficient $p_i$ is then replaced by an integer, k, where $L_k \leq p_i < L_{k+1}$. These integers, or a suitably coded version thereof, are stored in place of the coefficients, $p_i$.

An approximation to the image, $I'(x,y)$, can be reconstructed from the compressed representation, where $$I'(x,y) = \Sigma_i p'_i F_i(x,y)$$

where, for purposes of illustration, $p'_i = (L_k + L_{k+1})/2$, the average value of the two levels. Here, k is the integer stored in place of $p_i$.

From the above discussion, it will be apparent that an error of as much as half of the level spacing may be introduced by this quantization procedure. The above example set the levels with reference to $P_{min}$ and $P_{max}$ to simplify the discussion. Other methods for placing the $2^k$ levels so as to minimize the overall error resulting from the quantization process are known in the art. In general, these methods utilize the variance of the set of values $\{p_i\}$ and the statistical distribution of the values to set the level spacing. In this case, the level spacing is proportional to the variance. Hence, the larger the variance, the larger the quantization error. In general, the variance is determined by the image being quantized and the invertible transformation used to calculate the coefficients.

Hence, it is advantageous to provide an invertible transformation which minimizes the variance of the coefficients to be quantized. For a given image, it can be shown that the variance of the sets of coefficients $\{p_i\}$ and $\{q_j\}$ will be reduced if the basis functions $F_i(x,y)$ and $G_j(x,y)$ form an orthonormal basis for the two-dimensional image space.

The above described properties of the image transformation allow one to reduce the errors introduced at the quantization stage. However, there will always be errors. The manner in which these errors influence the reconstructed image will depend on the basis functions $F_i(x,y)$ and $G_i(x,y)$.

It is useful to distinguish the various classes of basis functions by the fraction of the image over which each of the basis functions is non-zero. This will be referred to as the support of the basis function.

If the basis functions have support which is of the same order of size as the image itself, then a quantization error in one coefficient will affect every point in the reconstructed image. This leads to aliasing errors in the reconstructed image. Such errors are subjectively very objectionable. For example, a quantization error in a single coefficient could lead to "stripes" extending across the entire reconstructed image.

A second problem occurs with basis functions having large support. As noted above, images tend to contain structures whose spatial extent is small compared to the size of the image. To represent such a structure with basis functions that have support which is much larger than the structure in question often requires the superposition of many such basis functions. Hence, the number of coefficients which contain useful information is likely to be larger if basis functions having support which is much larger than the objects found in the image are used.

If, on the other hand, the basis functions have support which is small, then a quantization error will only affect a small area of the reconstructed image. This leads to errors whose consequences are localized in the images and are more like random noise. As noted above, random noise errors can be incurred without producing a subjectively objectionable image.

The quantization errors are also related to the transform's ability to concentrate the essential image information into a set of coefficients which represents that information using the smallest number of bits. The number of bits needed to represent the image is the sum of two numbers. First, bits must be allocated to communicate the values of the coefficients produced by the transform which are saved for use in reconstructing the image. The second number is the number of bits needed to communicate which of the possible coefficients were saved after transformation. For any given compression ratio, the total number of available bits for representing the compressed image is fixed. Bits used for labels are unavailable for storing coefficient values. Hence, if a significant number of bits are needed for storing the label information, the number of bits available for quantization will be significantly reduced. This reduction in bits used for quantization results in larger quantization errors.

In general, the transformation of an $N \times N$ image can produce $N^2$ coefficients. The coefficients could be listed by giving a label specifying the identity of the coefficient and a number representing the value of the coefficient for each coefficient. If the transformation is effective, most of these coefficients will be zero or very small numbers. The minimum number of bits needed to represent the useful coefficients in this format would be the number needed to specify the label associated with each non-zero coefficient and the number of bits needed to adequately represent the value of that coefficient. One problem with this type of representation is the number of bits needed to communicate the labels.

Consider a $1000 \times 1000$ pixel image in which each pixel is digitized to 8 bits, i.e., 256 gray levels. Suppose a transformation were available which produced only 1000 coefficients that were non-zero out of the possible 1,000,000. Assume further that these coefficients are to be quantized to 8 bits. To specify the identity of each coefficient will require approximately 20 bits. Hence the total number of bits needed to specify the image in the compressed format would be $20,000+8,000=28,000$ bits. As a result, a compression ratio of less than 300:1 is obtained. In principle, a compression ratio of 1000:1 would be obtainable if one did not have to allocated bits for storing the labels.

Hence, in addition to concentrating the image information into a small number of coefficients, the transformation coefficients in question should form a subset whose identity does not depend on the specific image being transformed. In this case, the entire subset will be quantized. Since the position of a coefficient in the subset is equivalent to a label, there is no need to allocate bits for a label specifying the identify of each coefficient.

Prior art methods make use of the observation that the most important information appears to be concentrated in the low spatial frequencies for images. In prior art compression methods, the image is typically transformed to produce one set of coefficients representing the low frequency information and a plurality of sets of coefficients representing different high spatial frequency information. The individual sets are then quantized with differing degrees of precision. The only labeling information is then that required to identify the individual subsets. In this manner, the information needed to specify the "label" for each coefficient is reduced.

This reduction in label storage bits, however, results in an increase in the number of bits needed to represent the coefficients. In this scheme, all of the coefficients in any given subset are treated in the same manner. Hence, all of the coefficients in a particular subset must be quantized if any of the coefficients contains significant information.

Thus, it is advantageous to have a transformation which provides as much flexibility as possible in grouping the coefficients into subsets prior to quantization. In the simple transformation described above, an $N \times N$ image is transformed to provide $N_p$ low frequency coefficients $P_i$ and $N_q$ high frequency coefficients $q_j$. Ideally, one would like to find the smallest $N_p$ for which all of the useful information was in the $P_i$'s. In this case one would merely quantize the $P_i$ and ignore the second subset, i.e., the $q_j$'s.

As a result, it is advantageous to provide a transformation that allows one to chose the ratio of $N_p/N_q$. In general, image transformation do not allow one to set this ratio with arbitrary precision. Instead, one is presented with a number of steps. For example, in the solution taught by Adelson, et al. discussed below, ratios of 4, 16, 64, 256, and so on are provided. Transformations in which the steps in question are smaller are more desirable than those in which the steps are larger.

Although a number of transformations have been utilized in the prior art, none have provided all of these advantageous features. For example, one class of transformations is based on the Fourier expansion for the image transformation. The Fourier series basis functions have the advantage of providing an orthonormal basis for the image space. However, these functions have a number of disadvantages. First, the support of every Fourier basis function is the entire image. That is, each basis function is contributes to the entire image. As a result, quantization errors tend to produce aliasing errors which are subjectively unsatisfactory. Second, the computational work load to compute the Fourier transform is of order n log (n), where n is the number of pixels in the original image. To overcome this difficulty, the image is often divided into smaller sub-images which are pieced together after reconstruction. This procedure reduces the computational work load, but leads to other undesirable artifacts in the reconstructed image.

A second prior art solution to the image transformation problem is taught in U.S. Pat. No. 4,817,182 by Adelson, et al. In the method taught by Adelson, et al., the image is processed by a quadrature mirror filter bank (QMF) to produce four filtered images which are, in reality, four sets of coefficients. Three of the sets of coefficients are analogous to the $q_j$ discussed above in that they represent high spatial frequency information. The fourth set of coefficients is analogous to the $P_i$ in that these coefficients represent low-frequency information. The number of coefficients in each set is the same. Adelson, et al. teach treating the low-frequency components as an image of one quarter the size and then reprocessing the low-frequency coefficients using the same QMF. This iterative procedure leads to a pyramid of coefficient sets with a low-frequency set at the top and three sets of high-frequency coefficients at each level below the top. Each level represents information having higher frequency than the level above it.

It may be shown that this method is equivalent to the transformation discussed above with the $q_j$ being further divided into different subsets. Although Adelson, et al. refer to their QMF method as being equivalent to expanding the image in an orthonormal basis set, this method does not provide the claimed orthonormal expansion. The basis functions corresponding to a QMF are, by definition, symmetric. Using this property of the QMF basis functions, it can be shown that the QMF basis functions can not be an orthonormal set. Hence, this method does not provide the advantages of an orthonormal transformation of the image.

Another problem with the method taught by Adelson, et al. is that no means for selecting the QMF filter in terms of the image properties is taught. As a result, the basis functions taught therein do not optimally represent smoothly varying image features. For example, these basis functions can not exactly represent quadratic surfaces.

A still further problem with the method taught by Adelson, et al. is the inability to finely tune the compression ratio. Each time the filtering operation is applied, the number of coefficients in the $\{p_i\}$ set decreases by a factor of four. Hence, one only has the option of choosing compression ratios that are powers of four if only the $\{p_i\}$ are to be quantized. As a result, one must accept a very low compression ratio or device a strategy for determining which of the sets of $\{q_j\}$ are to be quantized.

Broadly, it is an object of the present invention to provide an improved apparatus and method for coding an image such that the coded image can be represented in fewer bits than the original image.

It is a further object of the present invention to provide an apparatus and method which utilize an orthonormal transformation of the image.

It is yet another object of the present invention to provide an apparatus and method in which the transformation utilizes basis functions having support which is small compared to the size of the image.

It is a still further object of the present invention to provide an apparatus and method in which the compression ratio may be selected in increments other than powers of four.

It is yet another object of the present invention to provide an apparatus and method in which the transformation utilizes basis functions that can adequately represent smoothly varying images such as low order polynomials.

It is a still further object of the present invention to provide an apparatus and method in which the transformation allows the high-frequency basis functions to be divided into a greater number of sub-classes than the prior art image compression transformations.

These and other objects of the present invention will become apparent to those skilled in the art from the following detailed description of the invention and the accompanying drawings.

BRIEF DESCRIPTION OF THE DRAWINGS

FIG. 11 is a block diagram of a decoding apparatus according to the present invention for reconstructing a D-dimensional image.

Table I provides examples of coefficients satisfying Equations 5(a), 5(b) and (6).

DETAILED DESCRIPTION OF THE INVENTION

Figure 1:
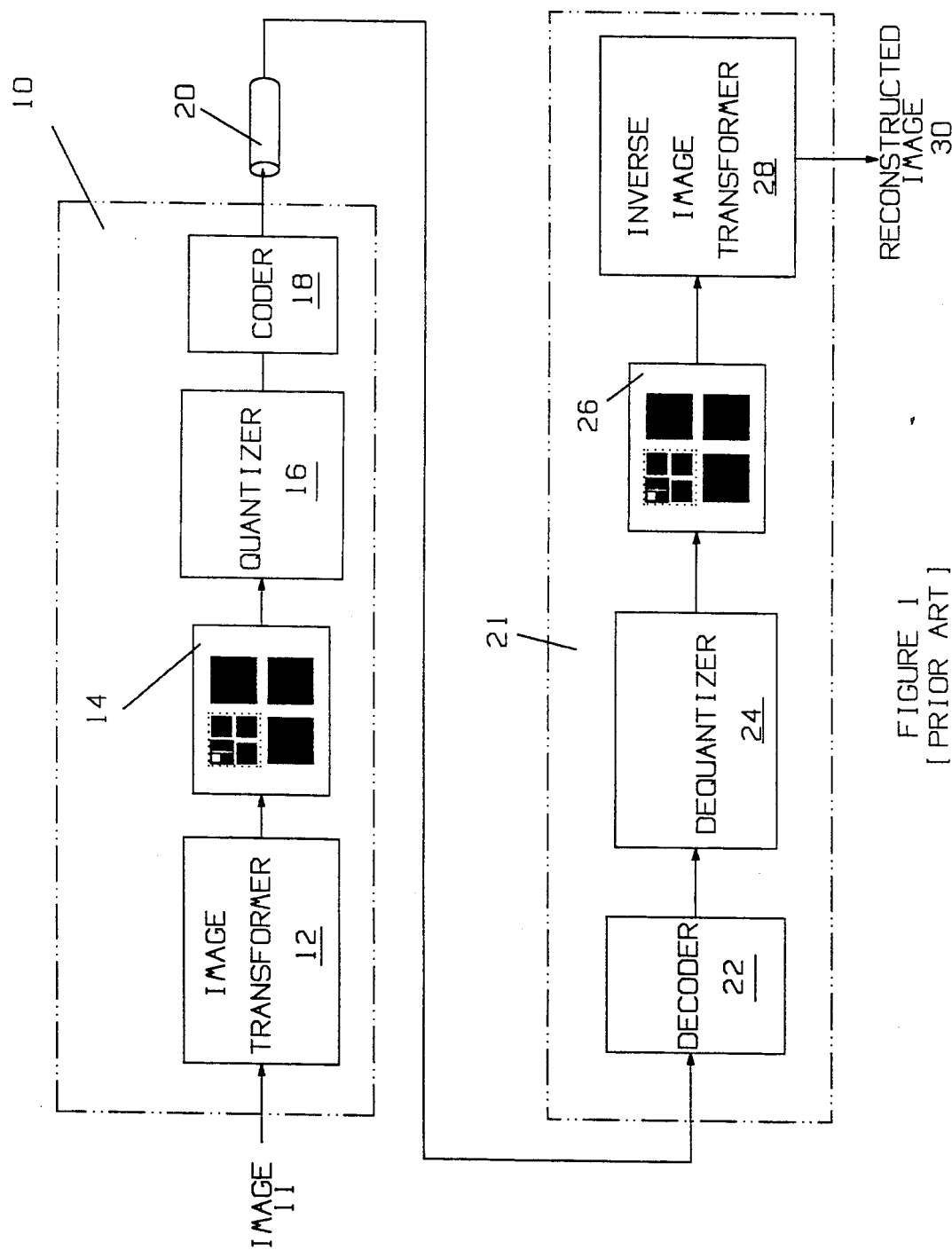
FIG. 1 is illustrates a typical prior art image compression system.

The present invention will be described in terms of an image compression system; however, it will be apparent to those skilled in the art that the method may be utilized to compress any multi-dimensional data array. The present invention may be more easily understood in the context of an image compression system. Such a system is shown in FIG. 1. The system includes an image compression sub-system 10 and an image decompression sub-system 21. The image compression sub-system 10 receives an image 11 and codes that image such that the coded version requires fewer bits to transmit than image 11. The coded image is typically transmitted on a communication link 20 to the image decompression sub-system 21 which generates a reconstructed image 30 from the encoded image. Alternatively, the coded image may be stored for later play-back.

Image compression sub-system 10 typically includes four elements. An image transformer 12 converts the original image into an array of transform coefficients 14. The transform coefficients are the coefficients of a linear expansion of the image in a basis system such as that described above. The array of transform coefficients 14 is then quantized by quantizer 16 to produce an array requiring fewer bits to store than array 14. As noted above, the quantization involves replacing each transform coefficient with an integer identifying the level in the quantization scheme corresponding to the transform value in question. Finally, the quantized coefficients are coded by coder 18 which takes advantage of redundancies in the quantized transforms to further reduce the number of bits that must be transmitted. Redundancy coding and the like are well known to those skilled in the art and hence will not be discussed here.

The reconstructed image 30 is obtained by reversing the process. The coding introduced by coder 18 is reversed by decoder 22 to produce a quantized array consisting of the integers representing the levels in the quantization scheme. The output of decoder 22 is inputted to a dequantizer 24 which replaces each level by the corresponding transform value. As noted above, the transform values provided by dequantizer 24 are approximations to the original transform values in array 14. The resultant transform array 26 is then converted to reconstructed image 30 by applying the inverse of the transformation utilized in transformer 12. This inversion is carried out by inverse image transformer 28.

Figure 2:
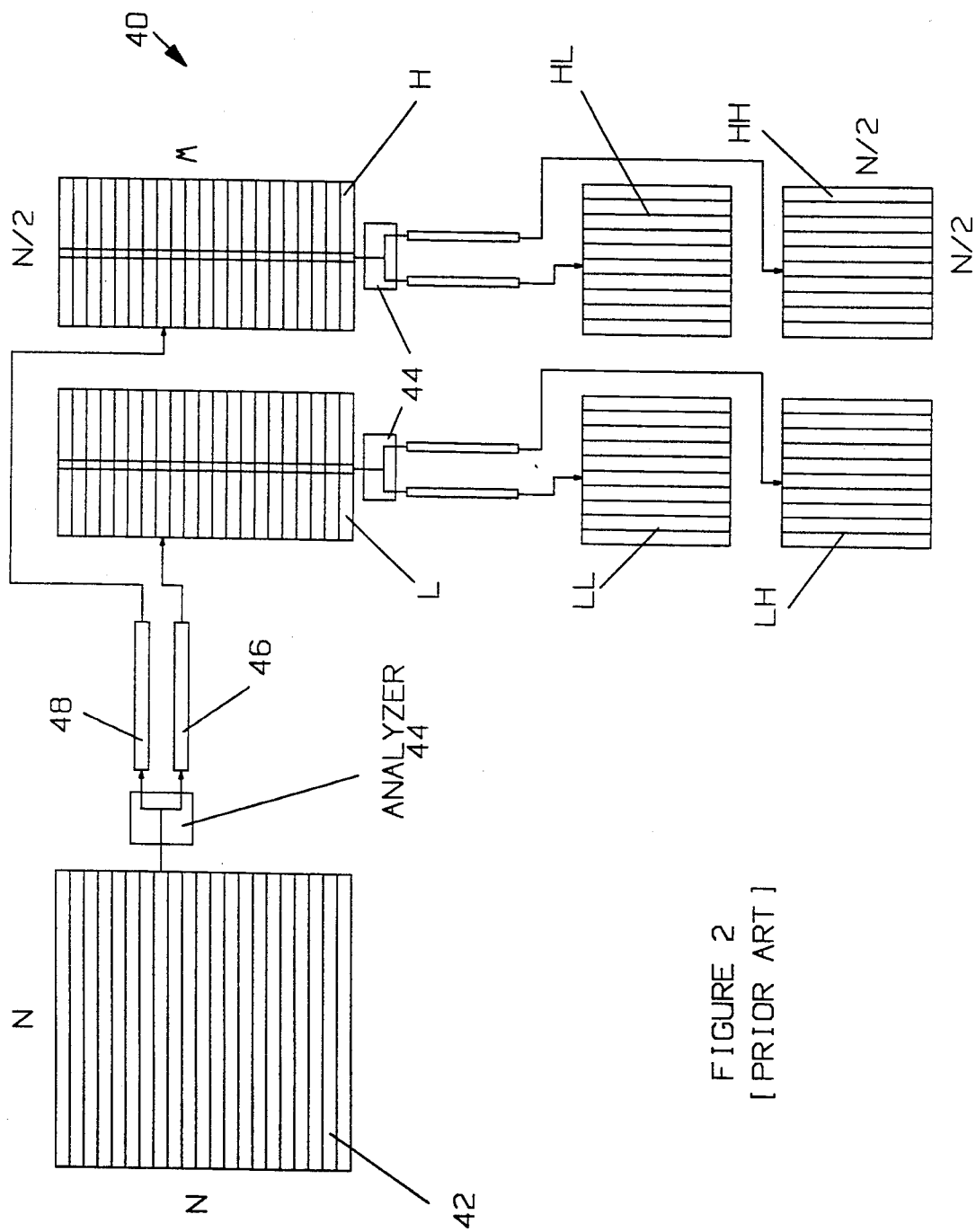
FIG. 2 is a block diagram of a prior art image encoding apparatus.

The improvements provided by the present invention are primarily the result of improvements in image transformer 12 and its corresponding inverse image transformer 28. The improvements provided by the present invention may be more easily comprehended by a comparison to a typical prior art image transformation system. Such a system is shown in FIG. 2 at 40. The transformation system is essentially that taught by Adelson, et al. in U.S. Pat. No. 4,817,182.

To simplify the following discussion, it will be assumed that transformation system 40 operates on an N×N pixel image 42. Image 42 may be viewed as consisting of N rows having N pixels per row. The transformation is accomplished in two stages. In the first stage, each row is transformed by an analyzer 44 to produce two linear arrays 46 and 48 representing the low and high frequency information, respectively, in the row. The arrays contain the coefficients corresponding to one-dimensional basis functions in a linear expansion of the function represented by each row. As taught in Adelson, et al., analyzer 44 comprises a quadrature mirror filter bank (QMF). Each row is treated as a "digital signal" which is filtered by the QMF. The low frequency array corresponding to each row is stored in a corresponding location in a first array labeled as L in FIG. 2. The high frequency array corresponding to each row is stored in a corresponding location in a second array labeled as H in FIG. 2. The L and H arrays each consist of N rows having N/2 coefficients per row.

In the second stage of the transformation, each of the L and H arrays is further transformed. Each array is viewed as comprising N/2 columns having N elements per column. Each column is analyzed by an analyzer 44 to generate first and second arrays analogous to those described above with reference to each row. The resultant linear arrays are stored in corresponding locations in four arrays LL, LH, HL and HH. The low and high frequency arrays generated from the columns in the L array are stored in array LL and LH, respectively. The low and high frequency arrays generated from the columns in the H array are stored in array HL and HH, respectively. Each of the four arrays LL, LH, HL, and HH has one quarter the number of elements of the original array 42.

This concatenation of two one-dimensional transformations may be shown to be equivalent to a single 2-dimensional transformation of the form $$I(x,y) = \Sigma^{LL}c_{i,j}{}^{LL}F_{i,j}(x,y) + \Sigma^{LH}c_{i,j}{}^{LH}F_{i,j}(x,y) + \Sigma^{HL}c_{i,j}{}^{HL}F_{i,j}(x,y) + \Sigma^{HH}c_{i,j}{}^{HH}F_{i,j}(x,y) \quad (1)$$

Here, the $^{LL}c_{i,j}$ are the coefficient values in the LL array; the $^{LH}c_{i,j}$ are the coefficient values in the LH array; the $^{HL}c_{i,j}$ are the coefficient values in the HL array, and the $^{HH}c_{i,j}$ are the coefficient values in the HH array. The corresponding basis function $^{LL}F_{i,j}(x,y)$, $^{LH}F_{i,j}(x,y)$, and $^{HH}F_{i,j}(x,y)$ may be calculated from a knowledge of the functions used in the QMF filters used in analyzer 44. Analyzer 44 produces a one-dimensional decomposition of the input signal S(x) into a series involving basis functions $^{L}R_k(x)$ and $^{H}R_k(x)$ and coefficients $^{L}b_k$ and $^{H}b_k$ according to the relationship $$S(x) = \Sigma^{L}b_k{}^{L}R_k(x) + \Sigma^{H}b_k{}^{H}R_k(x) \quad (2)$$

The set of coefficients $^{L}b_k$ are the coefficients comprising array 46, and the set of coefficients $^{H}b_k$ are the coefficients comprising array 48. The basis functions $^{LL}F_{i,j}(x,y)$, $^{LH}F_{i,j}(x,y)$, $^{HL}F_{i,j}(x,y)$, and $^{HH}F_{i,j}(x,y)$ may be written in terms of the functions $^{L}R_k(x)$ and $^{H}R_k(x)$; however, as will be discussed in detail below, the various coefficient arrays can be calculated without explicitly evaluating the functions in question.

As noted above, the transformation shown in Eq. (1) generates four arrays of coefficients, each array having one fourth the number of entries of the original image. The LL array comprises lower frequency information than the other arrays. As noted above, the lower frequency information is more important to human viewers. Hence, one could construct an image compression scheme in which each of the coefficients of the LL array is quantized with a greater number of bits than the coefficients of the other arrays. In the simplest version of this method, only the coefficients of the LL array would be quantized. That is, zero bits would be allocated for each of the coefficients in the LH, HL, and HH arrays. If the coefficients in the LL array are quantized using the same number of bits per coefficient that are used to represent the various pixel elements in the original image, then a compression ratio of 4:1 would be obtained.

To simplify the following discussion, it is useful to define the ratio of the number of pixels in the original image to the number of low frequency coefficients to be the simple compression ratio. This is the compression ratio that would be obtained if the low frequency coefficients were quantized to the same precision as the original pixels and the other coefficients were allocated zero bits. The example discussed above results in a simple compression ratio of 4.

Figure 3:
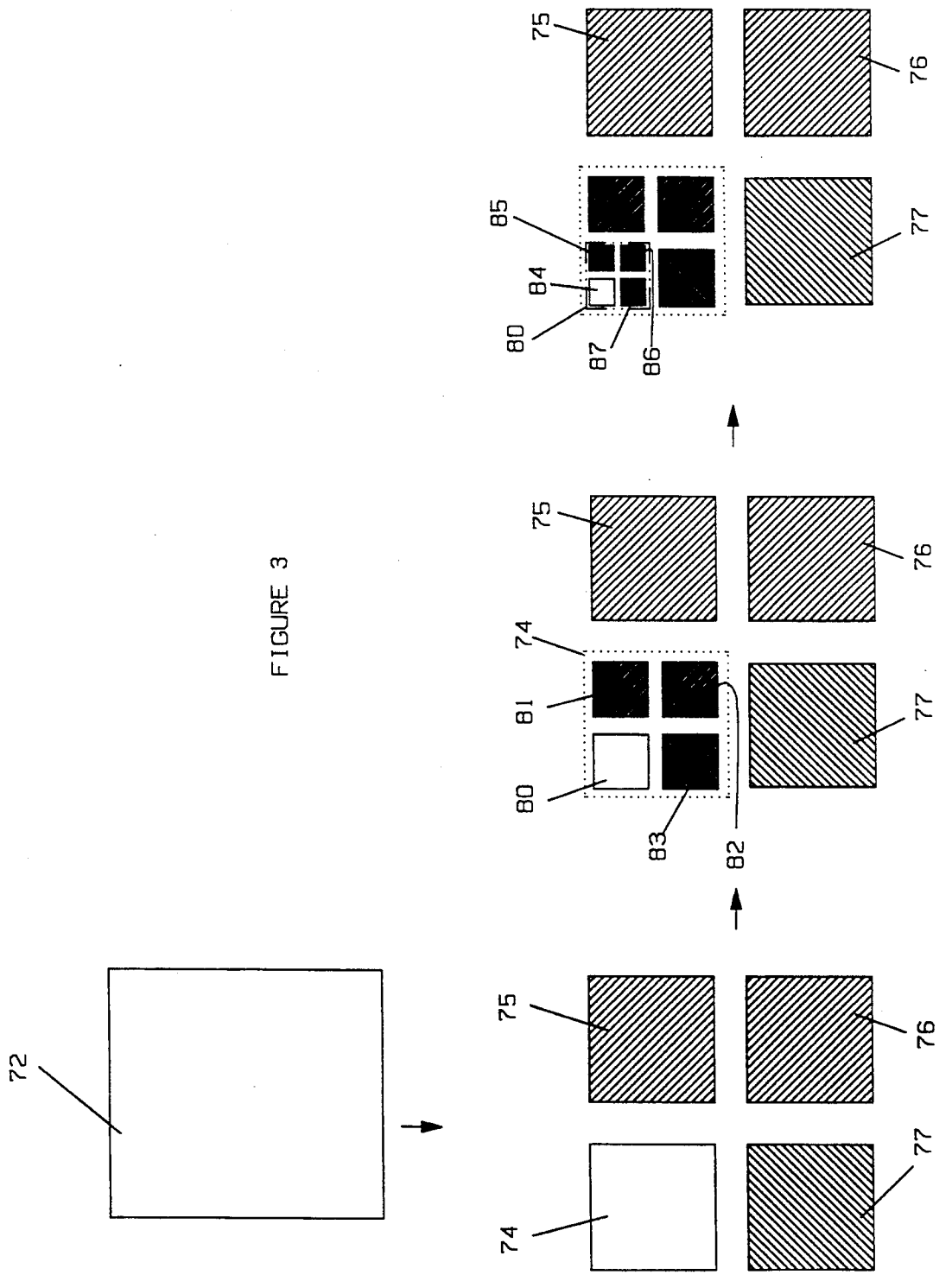
FIG. 3 illustrates how the apparatus shown in FIG. 2 may be used to provide compression ratios greater than 4.

It should be noted that the apparatus shown in FIG. 2 and the image transformation discussed above can be iterated to produce simple compression ratios of $4^k$, where k is any positive integer. The manner in which this is accomplished is more easily understood with reference to FIG. 3 which illustrates the transformation of an image 72 into sets of coefficients having a simple compression ratio of 64.

Image 72 is first input to image transformer 40 which generates four sets of coefficients 74–77 as described above with reference to FIGS. 1 and 2. Each set of coefficients has one fourth the number of elements of image 72. Coefficient set 74 is the LL set. The iteration is accomplished by treating the LL set from the previous transformation as an image which is then inputted to image transformer 40. Hence, coefficient set 74 is inputted to image transformer 40 which produces four new sets of coefficients 80–83. Each of these has one fourth the number of elements that were present in coefficient set 74. Hence, each of the coefficient sets 80–83 has 1/16th the number of elements of the original image. Coefficient set 80 is the LL coefficient set. Hence, it contains the information specifying the lowest spatial frequencies in the image. Coefficient sets 81–83 represent information which is intermediate in frequency between that represented by coefficient set 80 and that represented by coefficient sets 75–77.

The process can be repeated using coefficient set 80 as input to image transformer 40 thereby producing coefficients 84–87. Each of these sets has one fourth the number of coefficients that were present in coefficient set 80. Hence, coefficient set 84 which comprises the LL set has 1/64th the number of coefficients of the original image. Thus, this third application of the transformation results in an image transformation having a simple compression ratio of 64.

From the above discussion, it should be clear that the prior art image encoding schemes can produce only simple compression ratios of $4^k$. In general, the optimum image compression ratio will vary from image to image. Here, an image compression ratio is considered optimum if three conditions are met. First, the reconstructed image has the required image quality. Second, considerations such as acceptable computational workload are satisfied. And third, there is no other compression ratio which meets these conditions and provides a representation requiring significantly fewer bits to store the image.

Consider an image for which the optimum compression ratio for an application happened to be 32. If the prior art schemes are utilized, the user has two alternatives. First, a simple image compression ratio of 16 could be utilized with none of the high-frequency coefficients being quantized. This is clearly less than optimal. Second, a simple image compression ratio of 64 could be utilized with some of the high-frequency coefficients quantized in addition to the low-frequency coefficients. This latter method is only effective, however, if the information that was not adequately represented by the low-frequency components is concentrated in some small identifiable sub-set of the high-frequency coefficients. This condition is often not satisfied.

Hence, it would be advantageous to be able to specify the simple image compression ratio in steps between $4^k$ and $4^{k+1}$. An image transformer according to the present invention provides a means for transforming an image to provide simple compression ratios of $M^{2k}$ where M is any integer greater than 1.

An image transformer according to the present invention utilizes a new type of digital filter. As noted above, the prior art image transformation systems utilize a QMF to process each row (or column) of an image array to produce two transformed rows having one half the number of elements as the original row. As a result, one application of the transformation results in four arrays, each array having one fourth the number of elements of the original image array. This yields a simple compression ratio of 4. To obtain higher simple compression ratios, the transformation must be iterated.

An image transformer according to the present invention utilizes a filter that operates on each row (or column) of the image array to generate M output arrays. Each output array has approximately 1/M the number of elements of the original row (or column). One of these represents the low-frequency information in the row (or column); the others represent different forms of high-frequency information.

Figure 4:
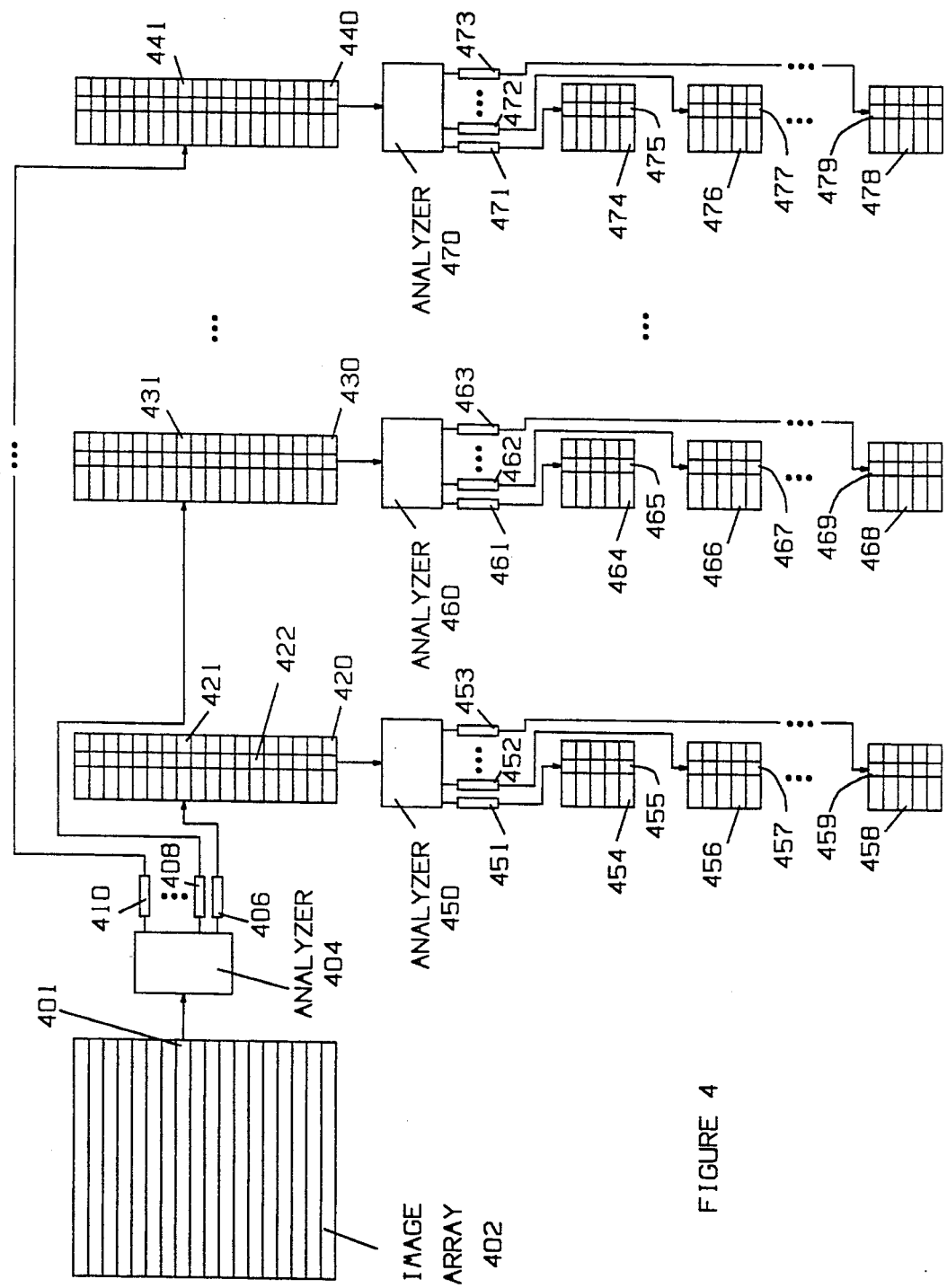
FIG. 4 is a block diagram of an image encoding apparatus according to the present invention.

An image is transformed in a manner analogous to that discussed above with reference to FIG. 2. The transformation of an image stored in an image array 402 utilizing an image transformer according to the present invention is shown in FIG. 4. Image array 402 is preferably a conventional memory array having rows and columns. For the purposes of this discussion, it will be assumed that image array 402 contains N columns and N rows. For the purposes of this discussion, it will be assumed that N is divisible by M. It will be apparent to those skilled in the art that the image may be "padded" to create an image in which the new N is divisible by M. Embodiments in which the number of rows differ from the number of column will be apparent to those skilled in the art.

In the first stage of the transformation each row of image array 402 is converted to M sets of coefficients by analyzer 404. The output of analyzer 404 comprises M output linear arrays each having a length of N/M in the preferred embodiment of the present invention. Cases in which the length is slightly greater than this will be discussed in more detail below. Each output linear array comprises a set of coefficients representing different frequency information from the row in image array 402 that is being processed. Output linear array 406 represents the low-frequency information. The other (M−1) output linear arrays represent various types of high-frequency information. Exemplary output arrays having high frequency information are shown at 408 and 410. A more detailed explanation of the type of information in the high-frequency output arrays will be provided below.

Each of the output linear arrays is stored in a corresponding row array. The low-frequency output linear array 406 is stored in row 421 of array 420 thereof. High-frequency linear array 408 is stored in row 431 of row array 430, and high-frequency linear array 410 is stored in row 441 of row array 440.

In the second stage of the transformation, each of the row arrays is treated as a plurality of columns and analyzed in a manner analogous to that described above with reference to the rows of image array 402. For example, column 422 of row array 420 is inputted as a linear array to analyzer 450 which generates M output arrays, output array 451 representing the low-frequency and the other M−1 output arrays representing the high-frequency information. Exemplary high-frequency output arrays are shown at 452 and 453. In the preferred embodiment of the present invention, each output array has N/M elements. Each output array is stored in a corresponding column of a corresponding image output array. Low-frequency output array 451 is stored in column 455 of image output array 454. High-frequency output array 452 is stored in column 457 of output image array 456, and high-frequency output array 453 is stored in column 459 of output image array 458.

The columns of row arrays 430 are treated in a like manner, the columns of row array 430 being processed by analyzer 460 to generate M output image arrays of which output image arrays 464, 466, and 468 are examples. The elements in these output arrays corresponding to elements discussed above with reference to analyzer 450 have been given similar numbers in the FIG. 4 and will not be discussed further. Similarly, row array 440 is processed by analyzer 470. Again, the elements in the output arrays corresponding to elements discussed above with reference to analyzer 450 have been given similar numbers in the FIG. 4 and will not be discussed further.

The image transformation described with reference to FIG. 4 generates $M^2$ output image arrays. Output image array 454 contains the low-frequency information from image array 402. The remaining output image arrays contain various forms of high-frequency information. Hence, it will be apparent to those skilled in the art that one application of an image transformation according to the present invention provides a simple compression ratio of $M^2$.

Any desired simple image compression ratio which is the square of an integer can be provided by the present invention either by selecting an appropriate M or by iterating the image transformation utilizing transformations. In this regard, it should be noted that the image transformation can be repeated using low-frequency output image array 454 as the input. If the first application of transformation utilizes an analyzer generating $M_1$ output arrays and the second application utilizes an analyzer having $M_2$ output arrays, then the combined transformation will have a simple compression ratio of $(M_1M_2)^2$.

The preferred embodiment of an image transformer according to present invention as discussed with reference to the FIG. 4 utilized different memory arrays for the image, row arrays, and image output arrays. However, it should be noted that a single memory array may be utilized for all three types of arrays. An embodiment of an image transformer according to the present invention which utilizes a single memory array is shown in FIG. 5(a)-(c). Referring to FIG. 5(a), the image is stored initially in image array 502 which is used to store both the row arrays and the output image arrays. Elements of this embodiment of the present invention which serve analogous functions to the embodiment shown in FIG. 4 are labeled with like numbers. Each row of the image is processed by analyzer 504 to produce M linear output arrays, a linear low-frequency array 506 and M−1 linear high-frequency arrays. Exemplary linear high-frequency arrays are shown at 508 and 510. FIG. 5(a) illustrates the transformation of row 501 in image array 502.

The linear output arrays are stored in the row of image array 502 from which they were derived. Linear output array 506 is stored at 521; linear output array 508 is stored at 531, and linear output array 510 is stored at 541.

After all of the rows have been processed, image array 502 is then processed by columns as shown in FIG. 5(b). Each column is processed by analyzer 550 to produce M linear output arrays, a linear low frequency array 551 and M−1 linear high frequency arrays. Exemplary linear high frequency arrays are shown at 552 and 553. FIG. 5(b) illustrates the transformation of column 522.

After all of the columns have been processed, image array 502 comprises $M^2$ image output arrays, a low frequency image output array 554 and $(M^2-1)$ high frequency output arrays. Exemplary image output arrays corresponding to the exemplary image output arrays shown in FIG. 4 are shown in FIG. 5(c). Like image output arrays are numbered with similar numbers.

Figure 5:
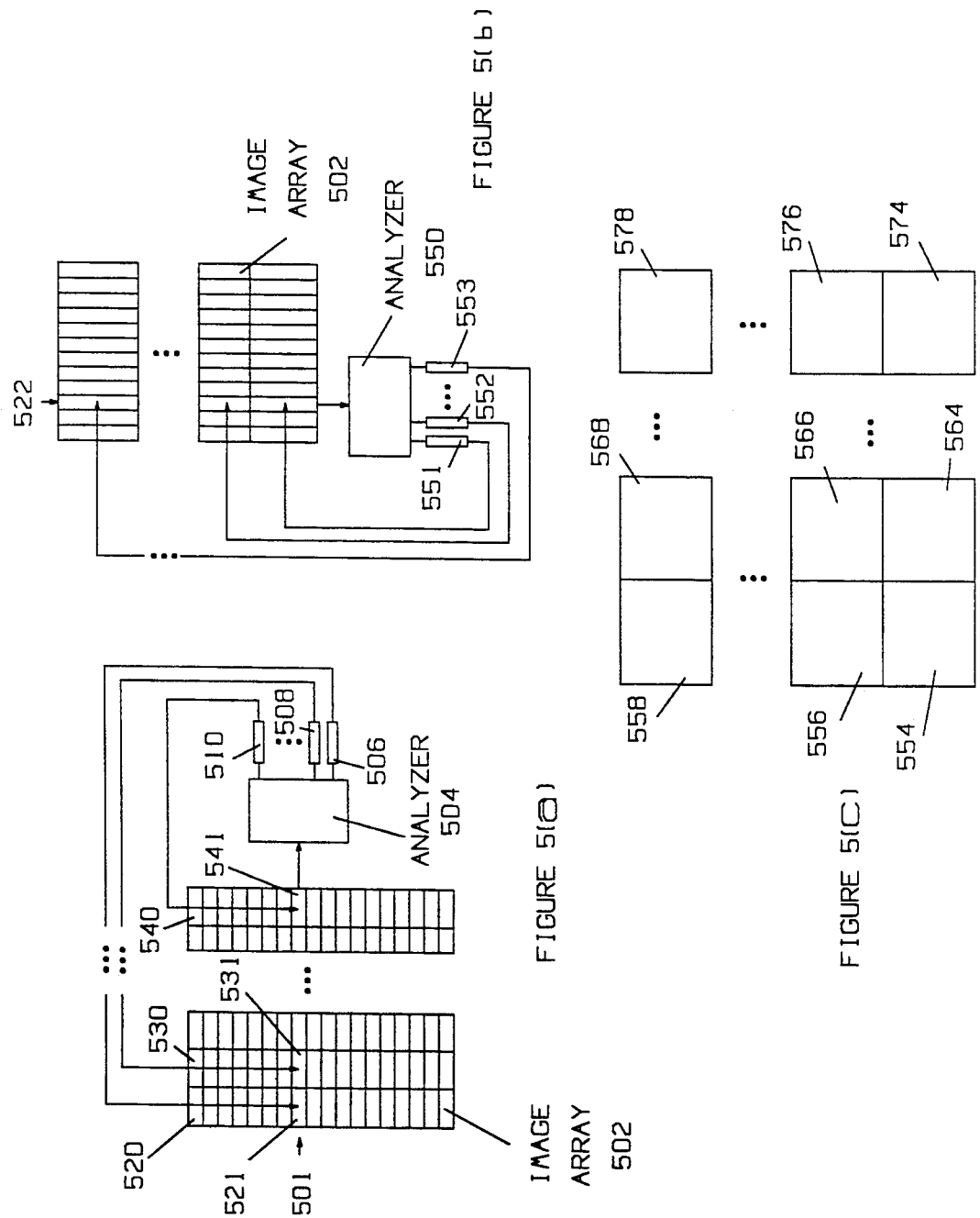
FIGS. 5a-5c show a block diagram of another embodiment of an image encoding apparatus according to the present invention.

While the embodiment of the present invention shown in FIG. 5 utilizes different analyzers for processing the rows and columns, it will be apparent to those skilled in the art that the same analyzer may be utilized for both processing operations. Although the preferred embodiment of the present invention utilizes special purpose hardware for performing an image transformation, it will also be apparent to those skilled in the art that the present invention may be practiced on a general purpose digital computer. Furthermore, it will be apparent to those skilled in the art that the labels "row" and "column" in the above description can be interchanged. Hence, it is to be understood that the present invention would operate equally well if the columns of the image were first filtered to provide column arrays. In this case, each row of each column array would then be filtered in the second stage of the image transformation.

The manner in which an analyzer according to the present invention is constructed will now be discussed in more detail with reference to FIG. 6 which is a block diagram of an analyzer 600. Analyzer 600 provides a low frequency output array and M−1 high frequency output arrays. Analyzer 600 comprises M finite impulse response (FIR) filters: one low frequency FIR filter 602 and (M−1) high frequency FIR filters. Exemplary high frequency FIR filters are shown at 604 and 606. The outputs of the various filters are stored in the linear output arrays described above with reference to the embodiments shown in FIGS. 4 and 5.

In the preferred embodiment of the present invention, the FIRs utilize digital filtering techniques. Each filter receives an input signal comprising a linear array of values which are either a row of pixel values or values resulting from the filtering of a row of pixel values. Each FIR comprises a means for convolving the input signal with a set of filter coefficients to provide an output signal. If the input signal consists of an array of values $S_j$ then the output of each filter consists of an array of values $v_p$ where $$^i v_p = (\Sigma_k {}^i a^*_k S_{Mp+k})/\sqrt{M} \qquad (3)$$

Here, the set of values $^i a^*_k$ for $k=1$ to $L$ are the filter coefficients utilized by the $i^{th}$ FIR filter. The (*) indicates complex conjugation. In general, a different set of coefficients is used for each filter. The superscript "i" is used to denote the filter in question. The coefficients utilized by the low frequency FIR will be denoted by $i=0$. The remaining (M−1) superscript values will be used to denote the coefficients used by the high frequency filters. The summation in Eq. (3) runs over all of the k values for which $^i a^*_k$ is non-zero. The manner in which the coefficients are determined will be discussed in detail below. In the following discussion, M is referred to as the multiplier of the transformation.

The number of non-zero output values $^i v_p$ will depend on the treatment of the edge of the image. Consider the case in which $S_j = I_{q,j}$. That is, S is the $q^{th}$ row of the image. Equation (3) references values of $I_{q,j}$ in which $j > N$ (the number of pixels in the row) or $j < 1$. If it is assumed that $S_j = 0$ for j values less than 1 or greater than N, then the number of potentially non-zero $^i v_p$ will be slightly more than N/M. If, however, S is assumed to be cyclic, i.e., $S_{N+j} = S_j$, then only N/M values need to be stored to exactly reproduce the image. As noted above, in the preferred embodiment of the present invention, N/M values are stored for each output. That is, in the preferred embodiment of the present invention, S is assumed to be cyclic.

In the preferred embodiment of the present invention, the input signal comprises a sequence of digital values which are consecutively shifted into each filter. Since each output value $^i v_p$ depends on a plurality of input values, the filters must have sufficient memory to store the previously received values needed for the calculation. The number of values which must be stored depends on the number of non-zero filter coefficients. In the preferred embodiment of the present invention, each filter is constructed from a dedicated convolution circuit having sufficient memory to store the required values. As each $^i v_p$ is generated, it is shifted into the corresponding linear output array.

However, alternate embodiments of the FIR filters which utilize the memory in the image array and row arrays will be apparent to those skilled in the art. If these memories are utilized, the FIR filtering operations may be carried out by a general purpose digital computer. Each filter can be replaced by a computer, or a single computer can be used to calculate the outputs. If this later embodiment is used, however, the time needed to filter the signal may become prohibitively long for some applications.

The manner in which the filter coefficients $^ia_k$ are calculated will now be discussed in detail. The filtering operation carried out by an analyzer according to the present invention is equivalent to expanding a function $S(x)$ having values $S_j$ on a set of discrete grid points $\{x_j\}$ in a linear series of the form $$S(x) = \Sigma^0 b_k {^0R_k}(x) + \Sigma_i \Sigma_k {^ib_k} {^iR_k}(x) \quad (4)$$

Here, the sum on i runs from 1 to (M−1), inclusive. The functions, $^0R_k(x)$ are the low frequency basis functions and the functions, $^iR_k(x)$, are the high frequency basis functions corresponding to the $i^{th}$ filter. The coefficients $^ib_k$ are the values outputted by the $i^{th}$ filter.

The filter coefficients must satisfy the following relation for the filters to provide high and low-frequency filtering:

$$\Sigma_p {^ia_p} = M\delta_{i,0} \quad (5a)$$

for all integer values i between 0 and (M−1) inclusive. The basis functions corresponding to the filter coefficients which satisfying Eq. (5a) are not necessarily orthogonal to one another. To impose the requirement that the basis functions be orthogonal to one another, the coefficients must also satisfy the following condition:

$$\Sigma_p {^ia^*_p} {^ja_{p+Mq}} = M\delta_{i,j}\delta_{0,q} \quad (5b)$$

where i and j are any integers between 0 and (M−1) inclusive and q is any integer. Here $\delta_{i,j}$ is the conventional delta function which is equal to 1 if i=j and 0 otherwise. The summation is carried out for those p values for which $^ia^*_p$ and $^ja_{p+Mq}$ are both non-zero.

In addition, it is advantageous to utilize basis functions which approximate polynomials. Consider an object in an image. The intensity variation across the object is often a smooth function which is approximated by a polynomial. If the filter coefficients are correctly chosen, the object can be approximated by a sum of low-frequency basis functions. In this case, the corresponding coefficients of the high-frequency basis functions will be small, i.e., little will be lost by replacing the corresponding high-frequency coefficients with zero. It can be shown that if the following relationship is satisfied, the low-frequency basis functions can approximate any polynomial surfaces of degree less than or equal to d:

$$\Sigma_k K^q {^ia_k} = 0 \quad (6)$$

for all i such that $0 < i \leq (M-1)$ and all q such that $0 \leq q \leq d$.

As noted above, it is advantageous to employ basis functions having small support. The support of the basis functions is related to the number of coefficients $^ia_p$ that are non-zero. In addition to providing more acceptable errors, utilizing basis functions with small support also reduces the computational workload. As can be seen from Eq. (3), the computational workload is proportional to the number of non-zero $^ia_p$. As was explained above, and in more detail below, it is also advantageous to utilize basis functions which approximate polynomials. This latter condition places a lower limit on the size of the support of the basis functions. It can be shown that the minimum number of non-zero filter coefficients for which the corresponding basis functions approximate second order polynomials is 3M. Since second order polynomials are the lowest order polynomials that can approximate curved surfaces, 3M is the preferred value for the number of coefficients.

Exemplary sets of coefficients satisfying Equations (5a), 5(b), and (6) are given in Table 1.

Figure 6:
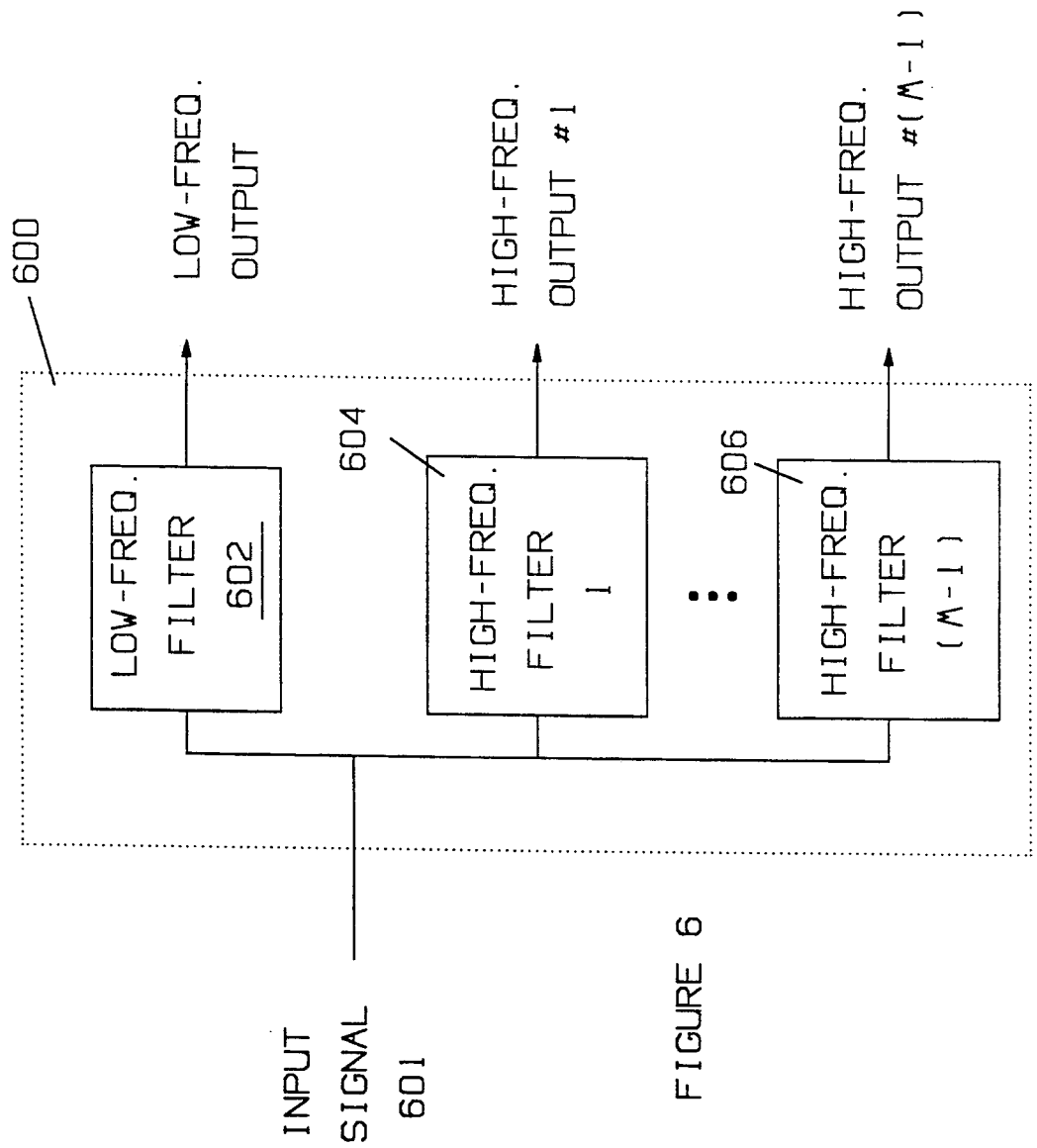
FIG. 6 is a block diagram of an analyzer according to the present invention.

Each of the filters in analyzer 600 shown in FIG. 6 is preferably constructed from a digital circuit for carrying out the computation shown in Eq. (5). Special purpose circuitry for carrying out such convolution calculations is well known to the signal processing arts, and hence, will not be discussed in detail here. In the preferred embodiment of the present invention, the various filters work in parallel. However, it will be apparent to those skilled in the art that a single digital computer could be used for simulating the parallel filter arrangement shown in FIG. 6.

Figure 7:
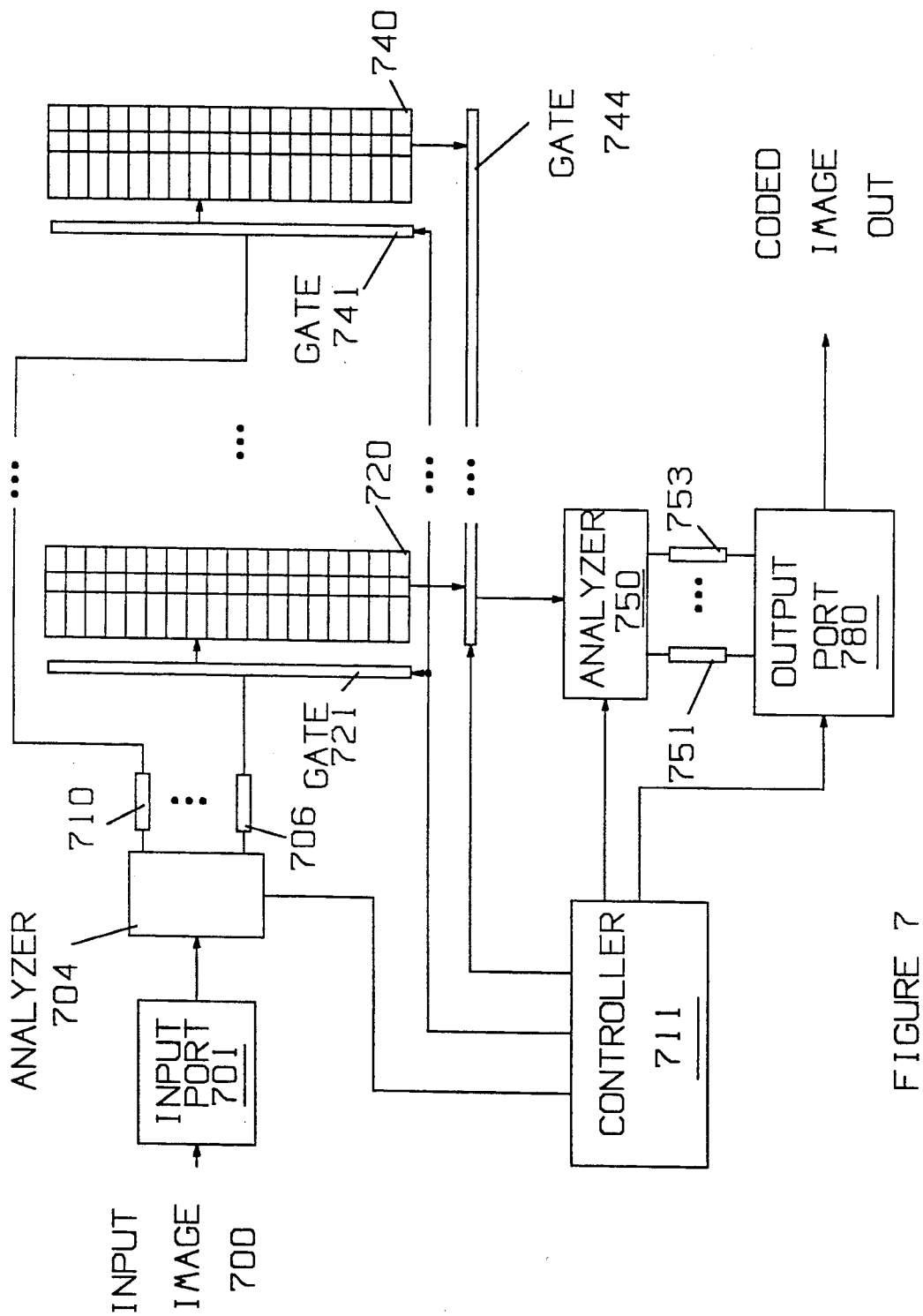
FIG. 7 is a block diagram of another embodiment of an image encoding apparatus according to the present invention.

In the embodiments of the present invention discussed above, the image was initially stored in a memory such as image array 402 shown in FIG. 4. However, such an initial storage of the image is not necessary. An embodiment of the present invention which avoids the initial storage is shown in FIG. 7. The image 700 to be coded is input to analyzer 704 one row at a time. Analyzer 704 may receive the image from a central memory or over a communication link. The image is received through an input port 701. As each row of image 700 is received, analyzer 704 generates M sets of image coefficients representing the information in different spatial frequencies in the row. Exemplary sets of coefficients are shown stored in registers at 706 and 710.

When the image coefficients for a given row have been generated, they are stored in corresponding rows of M row arrays. Exemplary row arrays are shown at 720 and 740. The coefficients are routed to the proper rows by gate circuits such as gates 721 and 741. Analyzer 706 and the various gate circuits are under the control of controller 711. Controller 711 also includes memory for storing the various sets of filter coefficients used by analyzer 720 to generate the image coefficients.

When the entire image has been received and image coefficients generated therefrom, a column analyzer 750 operates on each column of each row array to produce the final coding of the image. The particular column being analyzed at any given time is determined by gate circuit 744 which is also under the control of controller 711. Controller 711 also stores the filter coefficients used by the column analyzers in generating image coefficients from the columns in question. Each column analyzer preferably generates M sets of image coefficients using the same filter coefficients as used by analyzer 704. However, embodiments in which different sets of filter coefficients and different numbers of sets of image coefficients are generated for the rows and columns will be apparent to those skilled in the art.

Each set of image coefficients generated by the column analyzer 750 is stored in a corresponding register. Exemplary registers are shown at 751 and 753. These registers are coupled to an output port 780. As each column is processed, the image coefficients are read out in a predetermined order through output port 780 which is under the control of controller 711. Controller 711 also receives signals from external devices which coordinate its activities with those devices. For simplicity, the connections to the external devices have been omitted from the figure.

The registers connected to the row analyzer 704 and column analyzer 750 preferably comprise two sets of storage locations. At any given time, one set of locations is being filled with image coefficients which are being generated by the attached analyzer. At the same time, the other set of locations is being read out either into a row array or output port 780. Hence, the time needed to code an image using the present invention is essentially equal to that needed to read the image into the one row at a time and read out the final coefficients. This latter time is also approximately the needed to read in the image.

If the present invention is to be utilized in an image compression system in which not all of the high-frequency image coefficients are to be saved, then the corresponding memory arrays and analyzers may be omitted. In addition, some of the filters in the remaining analyzers may also be omitted.

While the embodiment shown in FIG. 7 utilizes two analyzers and gate circuits, it will be apparent to those skilled in the art that the embodiment shown in FIG. 7 may be simulated on a digital computer. In this case, the row memories would comprise regions of the computer's storage system, and the analyzers would be simulated by computer programs. The various gate circuits would comprise the memory address circuitry.

In addition to providing greater control in selecting the simple image compression ratio, the present invention is better adapted to parallel computation than analogous prior art devices. As noted above, the apparatus taught by Adelson, et al. must be iteratively applied to obtain simple image compression ratios greater than 4. Consider a case in which a simple image compression ratio equal to 64 is required. This is obtained by first analyzing the image to produce a first set of image coefficients comprising four sets of coefficients, each being one fourth the size of the image. The low-frequency set of image coefficients must then be re-analyzed generating a second set of image coefficients comprising four new sets of coefficients, each being $1/16^{th}$ the size of the original image. Finally, the low-frequency image coefficient set from this second set must be analyzed to produce a third set of coefficients comprising 4 sets of image coefficients, each being $1/64^{th}$ the size of the original image.

It should be noted that each iteration operates on the low-frequency image coefficients generated by the previous set of coefficients. Hence, the various iterations may not be carried out in parallel to reduce the overall computation time.

In contrast, the present invention would accomplish an image coding with a simple compression ratio of 64 in a single pass. In this case, analyzers having M=8 would be utilized. Each analyzer would include 8 convolution circuits working in parallel. The conversion of the image to the coefficients in the row arrays can be carried out as fast as the image can be received if an embodiment such as that described above with dual registers is utilized. Similarly, each column can be processed a column analyzer having dual registers and 8 convolution circuits in a time which is approximately equal to the time needed to read the column from the row array. This is essentially the same time as needed by the apparatus taught by Adelson, et al. to generate the first set of image coefficients.

Furthermore, if only the final low frequency image coefficients are to be kept, the present invention requires significantly less memory than the apparatus taught by Adelson, et al. If simple compression ratios greater than 4 are needed, then the prior art devices require the generation of the first set of image coefficients in which each row is converted to a low-frequency set of coefficients having one half the number of elements as the original row. Thus, even if all of the high-frequency coefficients are to be discarded, the device taught by Adelson, et al. requires a memory which is at least one half that required to store the entire image. This memory requirement is independent of the simple compression ratio. In contrast, if a simple compression ratio of $M^2$ is required, the present invention requires a memory which is only $1/M^{th}$ that required to store the entire image.

The coding scheme of the present invention may be reversed to generate an image from image coefficients produced by the transformation described above. The method in which the reconstruction of an image is accomplished may be more easily understood if the coefficients generated by the coding of the image are labeled as follows. As noted above, the row analyzer produces M sets of coefficients from each row of the input image, each set being stored as a row of one of the row arrays. Denote the $j^{th}$ pixel in the $i^{th}$ row of the input image by $I_{i,j}$, where i and j run from 1 to N. Referring again to FIG. 7, row analyzer 704 generates M sets of coefficients from each row. Denote the coefficients generated from the $i^{th}$ row by $^SD_{i,p}$, where s runs from 0 to M−1. Here, p runs from 1 to P, where P is approximately equal to N/M for the reasons discussed above. The coefficients $^SD_{i,p}$ are stored in the $i^{th}$ row of the $S^{th}$ row array for S=0 through M−1. By applying Eq. (3), it can be seen that $$^SD_{i,p}=(\Sigma_k {}^Sa_k I_{i,Mp+k})/\sqrt{M} \tag{7}$$

Column analyzer 750 converts each column in each row array to generate the final sets of coefficients. The column analyzer generates M sets of coefficients from each column, each set having P coefficients. Let R denote the row array from which a column is taken. Here, R runs from 0 to M−1, where M is the multiplier of the transformation. The case in which R=0 corresponds to the low frequency output of the analyzer. Then the coefficients representing the image can be denoted by $^{RS}C_{i,j}$, where i denotes the column in row array R that was used as input to the column analyzer, and j denotes the coefficient in $S^{th}$ set produced by the column analyzer. Here, i and j run from 1 to P. For notational convenience, a given set of coefficients will be denoted by $^{RS}C$ when referring to the set as a whole. A specific coefficient in a set will be denoted by $^{RS}C_{i,j}$. Again, it can be seen from Eq. (3) that $$^{RS}C_{i,j}=(\Sigma_k {}^Sa_k {}^RD_{Mj+k,i})/\sqrt{M} \tag{8}$$

Upon completion of the image coding, the present invention as discussed will have generated $M^2$ sets of coefficients. In the simplest case, all $M^2$ sets of coefficients will have been saved. In this case, the image can be exactly reconstructed. However, if not all of the sets of coefficients were saved, or some were saved to only limited precision, only an approximation of the original image can be reconstructed. It will be assumed that the sets of coefficients have been stored in a predetermined order together with data specifying which sets, if any, have been omitted and the filter coefficients used by the coding apparatus to generate the sets of image coefficients.

Figure 8:
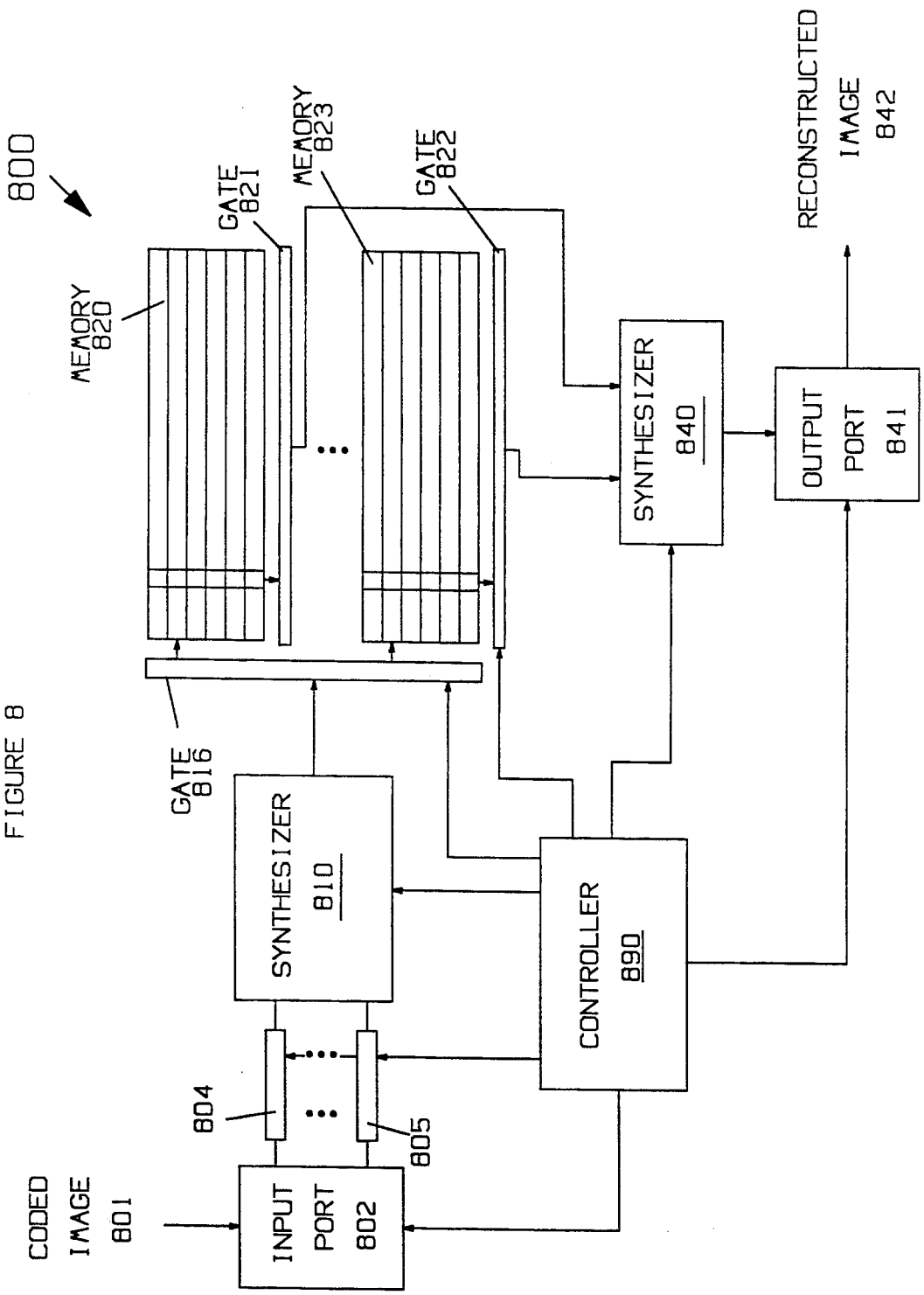
FIG. 8 is a block diagram of an image reconstruction apparatus according to the present invention.

A decoding apparatus according to the present invention is shown in FIG. 8 at 800. The coded image is preferably transmitted to the present invention in an order such that the M sets of coefficients generated from a given column are transmitted contiguously. That is, the coefficients $^{RS}C_{i,j}$, for j=1 to P and S=0 to M−1. The values of R and i are either inferred from the order in which the coefficients are sent or specified by data embedded in the input to input port 802. The image coefficients are received by an input port 802 which operates under the control of a controller 890. Input port 802 loads M input registers with the M sets of coefficients. Exemplary input registers are shown at 804 and 805.

A column synthesizer 810 converts the M sets of coefficients to a column array having approximately N elements, where N was the number of pixel in a row of the original image prior to coding. The synthesizer elements will be discussed in more detail below. For the purposes of this discussion, it is sufficient to note that a synthesizer performs the inverse of the transformation carried out by the analyzer elements shown in FIG. 7.

The column array generated by column synthesizer 810 is stored as one row in a row memory at a location specified by the values of R and i. There are M such row memories of which memories 820 and 823 are examples. A gate 816 is used to route the column array to the proper location in the proper row memory. R specifies the row memory in which the row array is stored, and i specifies the row in said memory. Each of the column arrays generated by synthesizer 810 is an approximation of a column in one of the row arrays in coding apparatus 700 discussed above with reference to FIG. 7.

After all of the column arrays have been generated, the row memories are read out one column at a time into a row synthesizer 840 which generates one row of the reconstructed image 842. In the preferred embodiment of the present invention, gates such as gate 821 and 822 are used to route the data in each of the columns to row synthesizer 840. As each row of the reconstructed image 842 is generated, it is output through output port 841.

The above description assumes that all of the sets of image coefficients are present in the coded image 801. If the coded image was compressed by removing one or more sets of image coefficients, this assumption will not be satisfied. In the preferred embodiment of the present invention, the input registers are initially loaded with zeros by controller 890 prior to receiving each group of coefficients. Input port 802 loads only those registers for which coefficients are received. Hence, image reconstruction apparatus assumes a value of zero for any missing image coefficients.

Figure 9:
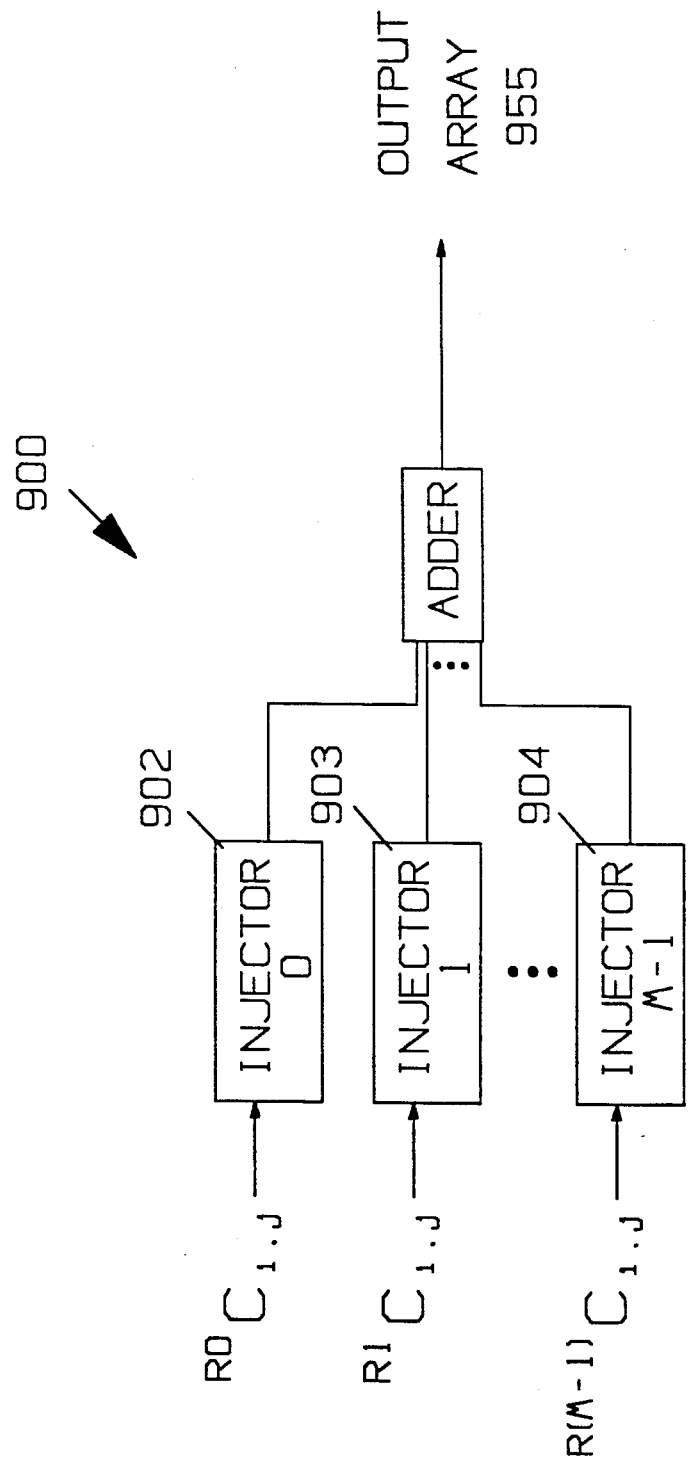
FIG. 9 is a block diagram of a synthesizer according to the present invention.

As noted above, the synthesizer elements perform the inverse of the transformation carried out by the analyzer elements shown in FIGS. 6 and 7. In the preferred embodiment of the present invention, the row and column synthesizers are structurally the same. A synthesizer according to the present invention is shown in FIG. 9 at 900.

In general, if the transformation used to encode the image had a multiplier equal to M, the synthesizer will have M injectors. In the following discussion, the injectors will be labeled 0 to M−1. Each injector processes one set of image coefficients, i.e., the $^{RS}C_{i,j}$ for fixed R and i. The injectors for processing the image coefficients corresponding to S=0, 1, and M−1 are shown at 902, 903, and 904, respectively. Each injector convolves the sequence of image coefficients input thereto with a set of filter coefficients to generate an injector output array $^{RS}A_{i,j}$, where $$^{RS}A_{i,j} = \Sigma_k {}^S a^*_{j-Mk} {}^{RS}C_{i,k} \tag{9}$$

where the summation is carried out over those k values for which $^S a_{j-Mk}$ is non-zero. Here, the sets of coefficients $\{^S a_m\}$ are the filter coefficients used to encode the original image. In the preferred embodiment of an injector according to the present invention, the injector includes memory for storing the relevant set of coefficients. If there are L values of $^{RS}C_{i,k}$ which are potentially non-zero, then there will be approximately ML j-values for which $^{RS}A_{i,j}$ is potentially non-zero.

The corresponding elements of the injector output arrays are added by adder 950 to generate the final output array 955. If the output array is denoted by $^RO_{i,j}$, then $$^RO_{i,j} = \Sigma_S {}^{RS}A_{i,j} \tag{10}$$

The value $^RO_{i,j}$ is stored in the (i,j)$^{th}$ position of the R$^{th}$ row memory.

The process is then repeated using synthesizer 840 operating on columns from the various row arrays to generate the reconstructed image 842.

If it is known that a particular set of image coefficients has not been saved, then the injector corresponding to that set may be eliminated. In simple image compression systems in which only the low-frequency image coefficients are retained, all of the injectors except the one for S=0 may be eliminated.

The above discussion has assumed that the original image was square. That is, the image comprised an array $I_{x,y}$ in which p and q ran from 1 to N. From the preceding discussion, it will be apparent to those skilled in the art that if x ran from 1 to $N_x$ and y ran from 1 to $N_y$, then the present invention would still generate $M^2$ sets of image coefficients $^{RS}C_{i,j}$; however, i and j would now run from 1 to approximately $N_x/M$ and $N_y/M$, respectively.

The above discussion also assumed that the row analyzer and column analyzer both utilized the same transformation. However, it will be apparent to those skilled in the art that embodiments in which different transformations are used may be advantageous for coding particular classes of images. If the row analyzer utilizes a transformation having a multiplier of $M_R$ and the column analyzer utilizes a transformation having a multiplier of $M_S$, then the present invention will generate $M_R M_S$ sets of image coefficients. In this case, the synthesizers used to reconstruct the image must use the corresponding inverse transformations. It should be noted that by utilizing a row analyzer having a different multiplier from that used by the column analyzer, a coding apparatus according to the present invention can, in principle, provide any simple compression ratio that can be written as the product of two-integers.

The above embodiments of the present invention have been described in terms of coding a two-dimensional image. However, it should be noted that the method and apparatus of the present invention can be applied to an array of arbitrary dimension. A two-dimensional image comprises a set of numbers in which each number has associated therewith two indices, e.g., the array $I_{i,j}$ described above. Similarly, a three-dimensional image comprises a set of numbers having three indices associated with each number. A motion picture is an example of a three-dimensional array. Each frame of the image is a two-dimensional array of pixels which has associated therewith a third index specifying the sequence of the two-dimensional array in the motion picture.

In general, a D-dimensional array comprises an array $I[k_1, k_2, \ldots k_D]$. Such an array can be coded into a low-frequency array and a plurality of high-frequency arrays by an embodiment of the present invention which is similar to that described above with reference to FIG. 5. The following discussion will be somewhat simplified by introducing the concept of a "dimension". The $j^{th}$ dimension of a D-dimensional data array $I[k_1, k_2, \ldots, k_D]$ is defined to be the set of all possible values $S[j]_i = I[k_1, k_2, \ldots, k_{j-1}, i, k_{j+1}, \ldots, k_D]$ for all possible values of the indices $k_1, k_2, \ldots, k_{j-1}, j_{+1}, \ldots, k_D$. Each possible value of the indices $k_1, k_2, \ldots, k_{j-1}, k_{j+1}, \ldots, k_D$ corresponds to a different value of the argument j. It may be seen from this definition that each dimension of the array comprises a plurality of linear arrays, one such linear array being defined for each value of j.

The coding of the image array $I[k_1, k_2, \ldots k_D]$ is accomplished in D steps, one such step for each dimension of the array. In each step, all of the linear arrays corresponding to the dimension in question are analyzed using an analyzer according to the present invention. In general, the analyzer generates M sets of coefficients from each such linear array. The coefficients so generated are stored back in the image array $I[k_1, k_2, \ldots k_D]$ at the locations previously occupied by the values used to generate the linear array in question.

The dimensions are processed in a predetermined order. Initially, the image array is loaded with the image to be coded. All of the linear arrays corresponding to a given dimension are analyzed before processing the linear arrays comprising the next dimension. When all of the linear arrays corresponding to the last dimension have been processed, the image array contains the image coefficients generated by the processing of the last dimension. In general, each linear array in the image array will contain M sets of coefficients corresponding to the coefficients generated by the last application of the analyzer to the previous contents of that linear array.

Figure 10:
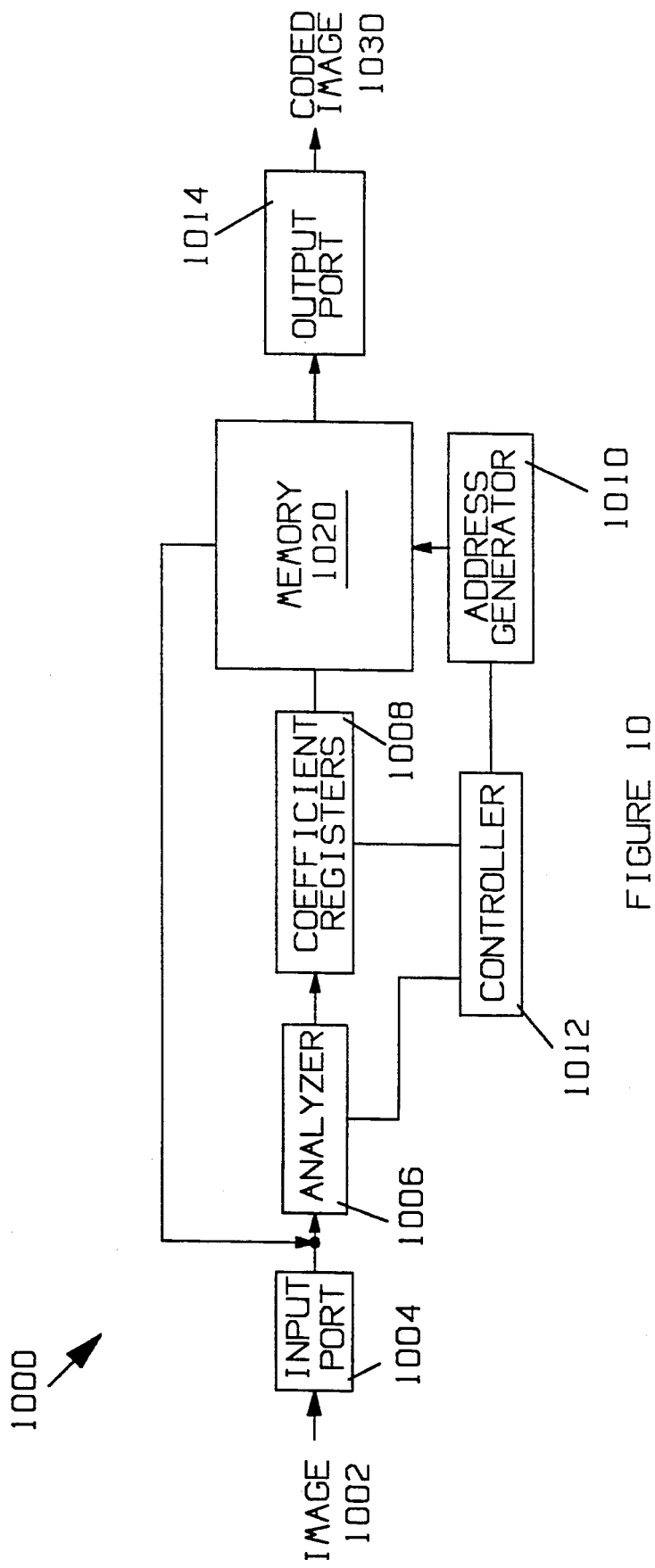
FIG. 10 is a block diagram of a coding apparatus according to the present invention for coding a general D-dimensional image.

A coding apparatus 1000 according to the present invention for coding a general D-dimensional image is shown in FIG. 10 at 1000. When utilized for coding an image comprising a D-dimensional array of pixel values, coding apparatus 1000 receives the image 1002 at an input port 1004. The image is preferably coded such that the elements $I[i, k_2, \ldots, k_D]$ for i=1 to $N_1$ are received sequentially for each of the various possible values of the remaining indices $k_2, \ldots, k_D$. All of the pixel values for each of a given set of index values $k_2, \ldots, k_D$ are preferably received before the value of $k_2, \ldots, k_D$ changes. That is, the image is preferably received in the order of the first set of linear arrays described above. This allows the first of the D steps in the image transformation to be performed as the image is received.

As each linear array is received, it is converted by analyzer 1006 into the corresponding low frequency coefficient array and (M−1) high frequency coefficient arrays. These arrays are stored in coefficient registers 1008 until the transformation of the linear array is completed. Coefficient registers 1008 preferably include M registers, one register for each set of coefficients. When the transformation is complete, the arrays of coefficients are stored in memory 1020 at predetermined locations which are determined by $k_2, \ldots, k_D$ and the identity of the coefficient arrays.

Once the image has been received and the first of the D conversion steps performed, controller 1012 generates the addresses needed to define the second dimension and the linear arrays associated therewith. Controller 1012 includes an address generator 1010 for this purpose. The elements of these linear arrays are then read out in order and inputted to analyzer 1006. Each linear array is converted to its corresponding coefficient arrays which are stored in coefficient registers 1008. At the end of the conversion of each array, the coefficient arrays are again stored back in memory 1020 at predetermined locations which depend on the value of j.

When all D/steps in the transformation have been completed, the coefficient arrays are read out in a predetermined order through output port 1030. It will be apparent to those skilled in the art, however, that the coefficient arrays can be read out directly from the coefficient registers at the end of the $D^{th}$ step in the conversion.

As noted above, there are applications in which it is known in advance that not all sets of coefficients are needed. For example, the coded image may form the basis of an image compression scheme in which only the low spatial frequency coefficients are to be saved. In this case, it will be apparent to those skilled in the art that analyzer 1006 need only generate the specific sets of coefficients to be saved. Furthermore, the calculations related to any dimension which does not contribute to the coefficients to be saved may be omitted. Hence, the minimum configuration of apparatus 1000 includes an analyzer 1006 which convolves each linear array with only one set of filter coefficients having multiplier greater than two. In general, this set will be the low-frequency set $\{^0a_p\}$; however, applications in which one of the high-frequency sets is used will be apparent to those skilled in the art.

It should also be noted that the sets of coefficients used by analyzer 1006 may depend on the dimension being processed. That is, different filter coefficients may be used for each dimension. In image compression systems, this type of coding may be superior to coding utilizing the same coefficients for each dimension.

A decoding apparatus 1100 for reconstructing an image from image coefficients such as those generated by coding apparatus 1000 is shown in FIG. 11. The coefficients 1102 comprise a D-dimensional array in which each linear array comprises M sets of coefficients. If not all of the coefficients generated by coding apparatus 1000 were saved, some of these sets may contain zeros in place of the coefficient values. The D-dimensional array of image coefficients is preferably received as the linear arrays corresponding to a predetermined dimension. If the D-dimensional array of coefficients is denoted by $C[k_1, \ldots, k_D]$, then the linear arrays $S'[j]_i$ are defined to be the values of $C[k_1, \ldots, k_{j-1}, i, k_{j+1}, \ldots, k_D]$.

As each linear array is received by input port 1104, it is divided into the M sets of coefficients which are then loaded in coefficient registers 1108. When all of the coefficient registers 1108 for a given linear array have been loaded, synthesizer 1106 generates a linear array $I'[j]_i$ therefrom utilizing the image coefficients $\{^ia_p\}$ used by coding apparatus 1000 in the coding of the original image. The operation of synthesizer 1106 is the same as that described above, and hence, will not be discussed in detail here. For the purposes of this discussion it is sufficient to note that synthesizer 1106 performs the inverse of the transformation carried out by analyzer 1006. That is, synthesizer 1106 comprises one or more injectors. Each injector convolves one of the possible M sets of image coefficients comprising the linear array $S'[j]_i$ with a set of image coefficients to generate a linear array having approximately LM elements where L is the number of coefficients in said set of image coefficients. Synthesizer 1106 then adds corresponding elements of the linear arrays generated by each injector to form the linear array $I'[j]_i$. Linear array $I'[j]_i$ is stored in memory 1120 at the location specified by $[k_1, \ldots, k_{j-1}, i, k_{j+1}, \ldots, k_D]$, where is the predetermined dimension in question.

The synthesis process is then repeated utilizing the remaining dimensions, one dimension at a time. The order of the dimensional processing is the reverse of the order used to code the original image. The linear arrays corresponding to each dimension are sent from memory 1120 to the coefficient registers 1108 by controller 1012. Each linear array is divided into the M sets of coefficients that comprise said array. The M sets of coefficients are then combined by synthesizer 1106 to form the linear array $I'[j]_i$ which is then stored in memory 1120 at the locations previously occupied by the M sets of coefficients.

When all of the dimensions have been processed, memory 1120 will contain the reconstructed image 1130 which may then be read out through output port 1114. It will be apparent to those skilled in the art that the reconstructed image may also be read out directly from synthesizer 1106 as each linear array $I'[j]_i$ for the last dimension is generated.

While the present invention has been described in relation to specific filters and hardware, it will be apparent to those skilled in the art that the present invention can be simulated on a general purpose digital computer having suitable software. The claims of the present invention are intended to encompass such simulations.

There has been described herein a novel apparatus and method for coding and decoding an image. Various modifications to the present invention will become apparent to those skilled in the art from the foregoing description and accompanying drawings. Accordingly, the present invention is to be limited solely by the scope of the following claims.

What is claimed is:

1. An apparatus for compressing an image comprising a two-dimensional array of pixel intensity values, said apparatus comprising:
   image storage means comprising means for storing said array of pixel intensity values as a plurality of rows and columns;
   linear filtering means for filtering a one-dimensional sequence of digital values to generate a low-frequency array representing the low-frequency components of said one-dimensional sequence and two or more high-frequency arrays representing high-frequency components of said one-dimensional sequence, said linear filtering means comprising means for convolving said one-dimensional signal with three or more sequences of filter coefficients $^i a_p$ wherein $$\sum_p {^i a_p} = M \delta_{i,0},$$

M is an integer greater than 2, i runs from 0 to the total number of high-frequency arrays so generated, and said low-frequency array is generated by convolving said one-dimensional sequence with the filter coefficient $^0 a_p$;
   row processing means for causing said linear filtering means to process each said row in said image storage means to generate a low-frequency row array comprising a two-dimensional array of digital values organized as a plutality of rows and columns and a plurality of high-frequency rows arrays, each said high-frequency row array comprising a two-dimensional array of digital values organized as a plurality of rows and columns; and
   column processing means for causing said linear filtering means to process each said column in said low-frequency row array to generate a low-frequency column array representing the low spatial frequency information in said image.

2. The apparatus of claim 1 wherein said column processing means further comprises means for causing said linear filtering means to process each said column in said high-frequency row arrays to generate a high-frequency column array representing the high spatial frequency information in said image.

3. The apparatus of claim 1 wherein said filter coefficients further satisfy the condition $$\sum_p {^i a^*_p} {^j a_{p+Mq}} = M \delta_{i,j} \delta_{q,0}$$

wherein q is any positive integer and (*) denotes complex conjugation.

4. The apparatus of claim 1 wherein said filter coefficients further satisfy the condition $$\sum_k k^q {^i a_k} = 0,$$

wherein said condition is satisfied for all $i > 0$ and any positive integer value q less than some predetermined value.

5. The apparatus for synthesizing an image comprising a two-dimensional array of pixel intensity values organized as a plurality of rows and columns from M two-dimensional sets of image coefficients, each said set of image coefficients being organized as a plurality of rows and columns, wherein M is greater than two, said apparatus comprising:
   coefficient storage means comprising means for storing said two-dimensional sets of image coefficients;
   linear synthesizing means for combining M one-dimensional input sequences of digital values to generates an output numerical sequence, wherein each of said one-dimensional sequences may be obtained by filtering said output numerical sequence through a finite impulse response filter having a set of filter coefficients $_i a_p$ corresponding to each said input sequence, wherein $$\sum_p {}^i a_p = M\delta_{i,0},$$

for i from 0 to M−1;

column processing means for causing said linear synthesizing means to combine corresponding columns of said sets of image coefficients to generate M column arrays, each said column array comprising a two-dimensional array of numerical values organized as a plurality of rows and columns; and row processing means for causing said linear synthesizing means to combine corresponding rows of said column arrays to generate a row of said reconstructed image.

6. The apparatus of claim 5, wherein said filter coefficients further satisfy the condition $$\sum_p {}^i a^*_p {}^j a_{p+Mq} = M\delta_{i,j}\delta_{q,0}$$

wherein q is any positive integer and (*) denotes complex conjugation.

7. The apparatus of claim 5 wherein said filter coefficients further satisfy the condition $$\sum_k k^q {}^i a_k = 0,$$

wherein said condition is satisfied for all i>0 and any positive integer value q less than some predetermined value.

8. In an apparatus including a linear filter for filtering a one-dimensional sequence of digital values to generate a low frequency array representing the low-frequency components of said one-dimensional sequence and two or more high-frequency arrays representing high-frequency components of said one-dimensional sequence, said linear filter comprising means for convolving said one-dimensional signal with three or more sequences of filter coefficients ${}^i a_p$ wherein $$\sum_p {}^i a_p = M\delta_{i,0},$$

M is an integer greater than 2, i runs from 0 to the total number of high-frequency arrays so generated, and said low-frequency array is generated by convolving said one-dimensional sequence with the sequence ${}^0 a_p$, a method for compressing an image comprising a two-dimensional array of pixel intensity values, said method comprising the step of:

storing said array of pixel intensity values as a plurality of rows and columns;

filtering a one-dimensional sequence of digital values to generate a low-frequency array representing the low-frequency components of said one-dimensional sequence and two or more high-frequency arrays representing high-frequency components of said one-dimensional sequence, said filtering step comprising convolving said one-dimensional signal with three or more sequences of filter coefficients ${}^i a_p$ wherein $$\sum_p {}^i a_p = M\delta_{i,0},$$

M is an integer greater than 2, i runs from 0 to the total number of high-frequency arrays so generated, and said low-frequency array is generated by convolving said one-dimensional sequence with the sequence ${}^0 a_p$;

causing said linear filter to process each said row in said image storage means to generate a low-frequency row array comprising a two-dimensional array of digital values comprising a two-dimensional array of digital values organized as a plurality of rows and columns and a plurality of high-frequency row arrays, each said high-frequency row array comprising a two-dimensional array of digital values organized as a plurality of rows and columns; and causing said linear filter to process each said column in said low-frequency row array to generate a low-frequency column array representing the low spatial frequency information in said image.

9. The method of claim 8 further comprising the step of causing said linear filter to process each said column in said high-frequency row arrays to generate a high-frequency column of arrays representing the high spatial frequency information in said image.

10. The method of claim 8 wherein said filter coefficients further satisfy the condition $$\sum_p {}^i a^*_p {}^j a_{p+Mq} = M\delta_{i,j}\delta_{q,0}$$

wherein q is any positive integer and (*) denotes complex conjugation.

11. The method of claim 8 wherein said filter coefficients further satisfy the condition $$\sum_k k^q {}^i a_k = 0,$$

wherein said condition is satisfied for all i>0 and any positive integer value q less than some predetermined value.

12. In an apparatus including a linear synthesizing means for combining M one-dimensional input sequences of digital values to generate an output numerical sequence, wherein each of said one-dimensional sequences may be obtained by filtering said output numerical sequence through a finite impulse response filter having a set of filter coefficients ${}^i a_p$ corresponding to each said input sequence, wherein $$\sum_p {}^i a_p = M\delta_{i,0},$$

for i from 0 to M−1, a method for synthesizing an image comprising a two-dimensional array of pixel intensity values organized as a plurality of rows and columns from M two-dimensional sets of image coefficients, each said set of image coefficients being organized as a plurality of rows and columns, wherein M is greater than two, said method comprising:

storing said two-dimensional sets of image coefficients;

causing said linear synthesizing means to combine corresponding columns of said sets of image coefficients to generate M column arrays, each said column array comprising a two-dimensional array of numerical values organized as a plurality of rows and columns; and causing said linear synthesizing means to combine corresponding rows of said column arrays to generate a row of said reconstructed image.

13. The method of claim 12 wherein said filter coefficients further satisfy the condition $$\sum_p {}^i a^*_p {}^j a_{p+Mq} = M\delta_{i,j}\delta_{q,0}$$

wherein q is any positive integer and (*) denotes complex conjugation.

14. The method of claim 12 wherein said filter coefficients further satisfy the condition $$\sum_k k^q {}^i a_k = 0,$$

wherein said condition is satisfied for all $i > 0$ and any positive integer value q less than some predetermined value.

* * * * *

UNITED STATES PATENT AND TRADEMARK OFFICE
CERTIFICATE OF CORRECTION

Page 1 of 2

PATENT NO. : 5,148,498
DATED : September 15, 1992
INVENTOR(S) : Resnikoff, et al.

It is certified that error appears in the above-identified patent and that said Letters Patent is hereby corrected as shown below:

Column 1, line 39, delete "sone" and insert therefor --some--.

Column 9, line 54, after "$^{LH}F_{ij}(x,y)$" insert --$^{HL}F_{ij}(x,y)$--.

Column 19, line 17, delete "pixel" and insert therefor --pixels--.

Column 24, line 63, delete "generates" and insert therefor --generate--.

Column 25, line 53, delete "step" and insert therefor --steps--.

Column 5, line 42, delete "allocated" and insert therefor --allocate--.

Column 5, line 62, delete "that".

Column 6, line 16, delete "chose" and insert therefor --choose--.

Column 6, line 33, delete "is".

Column 7, line 55, delete "is".

Column 11, line 62, delete "column" and insert therefor --columns--.

Column 12, line 43, delete "the" before "Figure 4".

Column 12, line 48, delete "the" before "Figure 4".

UNITED STATES PATENT AND TRADEMARK OFFICE
CERTIFICATE OF CORRECTION

PATENT NO. : 5,148,498

DATED : September 15, 1992

INVENTOR(S) : Resnikoff, et al.

It is certified that error appears in the above-identified patent and that said Letters Patent is hereby corrected as shown below:

Column 13, line 5, delete "the" before "Figure 4".

Column 15, line 22, delete "satisfying" and insert therefor --satisfy--.

Column 17, line 9, delete "the" before "needed" and insert therefor --that--.

Column 22, line 36, after "having" insert --a--.

Signed and Sealed this

First Day of February, 1994

Attest:

BRUCE LEHMAN

Attesting Officer     Commissioner of Patents and Trademarks